(12) United States Patent
Hershenson et al.

(10) Patent No.: US 7,458,041 B2
(45) Date of Patent: Nov. 25, 2008

(54) CIRCUIT OPTIMIZATION WITH POSYNOMIAL FUNCTION F HAVING AN EXPONENT OF A FIRST DESIGN PARAMETER

(75) Inventors: Mar Hershenson, Los Altos, CA (US); David M. Colleran, San Mateo, CA (US)

(73) Assignee: Magma Design Automation, Inc., San Jose, CA (US)

( * ) Notice: Subject to any disclaimer, the term of this patent is extended or adjusted under 35 U.S.C. 154(b) by 290 days.

(21) Appl. No.: 11/021,278

(22) Filed: Dec. 22, 2004

(65) Prior Publication Data

US 2006/0075365 A1 Apr. 6, 2006

Related U.S. Application Data

(60) Provisional application No. 60/614,745, filed on Sep. 30, 2004.

(51) Int. Cl.
*G06F 17/50* (2006.01)
(52) U.S. Cl. .............................................. 716/2; 716/4
(58) Field of Classification Search ................ 716/2, 716/4, 6
See application file for complete search history.

(56) References Cited

U.S. PATENT DOCUMENTS

| | | | |
|---|---|---|---|
| 4,827,428 A | 5/1989 | Dunlop et al. | |
| 5,404,319 A | 4/1995 | Smith et al. | |
| 6,269,277 B1 | 7/2001 | Hershenson et al. | |
| 6,311,145 B1 | 10/2001 | Hershenson et al. | |
| 6,425,111 B1 | 7/2002 | Hershenson et al. | |
| 6,671,663 B1* | 12/2003 | Hellums et al. | 703/14 |
| 6,909,330 B2 | 6/2005 | Colleran et al. | |
| 6,954,921 B2 | 10/2005 | Hassibi et al. | |
| 2002/0117736 A1 | 8/2002 | Yamazaki et al. | |
| 2002/0184603 A1* | 12/2002 | Hassibi et al. | 716/2 |
| 2003/0202669 A1* | 10/2003 | Boor | 381/111 |
| 2005/0146971 A1* | 7/2005 | Hidaka | 365/226 |

OTHER PUBLICATIONS

Boyd, S. et al. Circuit Design Via Geometric Programming, ICCAD Tutorial (presented at annual International Conference on Computer Aided Design meeting), Nov. 11, 2004 (107 pages).
Boyd, S.P. et al. A Tutorial on Geometric Programming, Sep. 12, 2004 (62 pages).
Daems, W. Simulation-Based Generation of Posynomial Performance Models for the Sizing of Analog Integrated Circuits, in IEEE Transactions on Computer-Aided Design of Integrated Circuits and Systems, May 2003, vol. 22, No. 5, pp. 517-534.

(Continued)

*Primary Examiner*—Stacy Whitmore
(74) *Attorney, Agent, or Firm*—Blakely, Sokoloff, Taylor & Zafman, LLP

(57) ABSTRACT

Methods for optimizing design parameters of a circuit are disclosed. In one aspect, an optimization problem includes one or more performance specifications that represent an exponent of a design parameter to be optimized. Various parameters of passive and active circuit devices may be efficiently and accurately optimized as a result. In another aspect, linear performance specifications are included for accurately calculating voltages. In yet other aspects of the invention, three special types of convex optimization problems are disclosed for enabling the above use of exponents of design parameters which provide efficient and accurate calculations of a virtually unlimited array of circuit parameters and performance characteristics.

38 Claims, 12 Drawing Sheets

OTHER PUBLICATIONS

Kim, J. et al. Techniques for Improving the Accuracy of Geometric-Programming Based Analog Circuit Design Optimization, in Proceedings of International Conference on Computer Aided Design, Nov. 2004, pp. 863-870.

Li, X. et al. Robust Analog/RF Circuit Design with Projection-Based Posynomial Modeling, in Proceedings of International Conference on Computer Aided Design, Nov. 2004, pp. 855-862.

Mandal, P. et al. CMOS Op-Amp Sizing Using a Geometric Programming Formulation, in IEEE Transactions on Computer-Aided Design, Jan. 2001, vol. 20, pp. 22-38.

Vanderhaegen, J.P. et al. Automated Design of Operational Transconductance Amplifiers Using Reversed Geometric Programming, in Proceedings of the 41st Annual Design Automation Conference, Jun. 7-11, 2004 (6 pages).

Stephen P. Boyd, et al., "A Tutorial On Geometric Programming", Department of Electrical Engineering, Stanford University, Sep. 12, 2004, pp. 1-62, Stanford, CA.

International Search Report and the Written Opinion dated Jan. 7, 2008, pp. 14.

* cited by examiner

CIRCUIT OPTIMIZATION WITH POSYNOMIAL FUNCTION F HAVING AN EXPONENT OF A FIRST DESIGN PARAMETER

RELATED APPLICATION DATA

This application claims priority to U.S. provisional application Ser. No. 60/614,745, entitled "Novel Optimization For Circuit Design", filed Sep. 30, 2004, Mar Hershenson and David M. Colleran, inventors. The content of this provisional application is incorporated by reference as though fully set forth herein.

BACKGROUND OF THE INVENTION

1. Field of Invention

The present invention relates generally to circuit design, and more specifically to methods for designing circuits using equation-based optimization.

2. Description of Related Art

The need for more efficient and effective equation and software-based methods for integrated circuit design has become paramount for today's businesses involved in the development of electronic and computer devices. Over the last decade, various such methods have been introduced in the arenas of both digital and analog circuit design. As the level of sophistication of electronic devices and their constituent components has increased, so too have the requirements for design solutions uniquely tailored to this level of sophistication. The desire for more precise and efficient methods has become evident as the sophistication of modern integrated circuits continues to increase exponentially.

While many types of digital integrated circuits are designed using an automated synthesis flow based on a library of pre-designed cells, other types of circuits are still custom designed, especially those where high performance is needed (e.g., microprocessors, mixed-signal circuits, and the like). Custom circuit design is typically far more complex than standard-cell based design. In custom circuit design, the basic building blocks include transistors, capacitors, interconnects, and similar devices, rather than fixed size gates. The synthesis process in custom design is manual rather than based on a logic synthesis tool. Further, the physical custom designs are not structured and may take a variety of forms.

In custom circuit design, the designer has virtually complete control over the circuit topology, specific sizes, cell layout and overall circuit physical design. The fact that the designer has little design constraints (e.g., the designer can use any device size within limits rather than just a fixed size), allows him or her to be able to create very high performance circuits. However, this gain in performance comes at a cost: complexity of the design process.

Unfortunately, the complexity of the design process has only increased over time. The reasons include, among others, the increased technology scaling, the higher levels of on-chip integration, the fact that analog design cycles have become as short as digital design cycles, and the large process parameter variations in current process technologies. Most custom design is performed manually by a reduced number of expert designers using the same techniques that were used twenty years ago. The problem is exacerbated by a shortage of custom circuit designers, especially analog designers. As consumer demand for more sophisticated products shipped faster to market has grown, the need for more efficient design tools has become more critical to companies attempting to accommodate these schedules.

In the traditional custom design method, the designer typically starts from a set of specifications and a target process. Then, the designer chooses a promising circuit architecture or topology. After which, the designer proceeds to the component sizing process, i.e., to determine the sizes or values of the components that achieve the requirements of the desired performance. Compared to designs using a standard cell library, the number of design variables is generally relatively small (often only a few tens or hundreds). Unlike standard cell design, the performance of custom circuit designs are typically very sensitive to small changes in design variables. The designer must be very precise in determining all of the design variables, or the resulting circuit performance will be poor at best. More likely, the circuit simply will not function.

Additionally, each design variable using the custom design approach typically affects all the performance indices in a complex, highly nonlinear way. The traditional approach to component sizing repeatedly cycles through circuit simulation with a tool like SPICE, and updating, or tweaking, the design variables either manually or with an automated search engine.

This custom design flow nevertheless enjoys a significant advantage in that circuits may be hand-crafted to maximize performance. The designer typically spends a long time tweaking the circuit and trying to obtain the greatest amount of performance possible out of it in light of the constraints within which he or she must work. Unfortunately, this custom design flow has several disadvantages. First, the process is extremely time consuming. In fact, given the choice, designers would spend longer time tweaking the variables on their designs than schedules permit. Generally, it is very difficult to determine when to stop tweaking a circuit to achieve maximum performance. Also, the custom design approach relies heavily on an experienced custom designer not only to create a completely new custom circuit from scratch, but also to port an existing circuit to a new process technology. The custom design flow does not encapsulate the knowledge of the experienced designer and as such it cannot be used later by a less experienced designer, or even re-used by the experienced designer to modify the existent circuit efficiently.

In an attempt to overcome many of these obstacles, equation-based synthesis methods for custom circuit design have been implemented or proposed in the literature. In equation-based methods, the design problem is cast as a mathematical optimization problem, which is then solved by a numerical algorithm. The resulting problem is cast as either a general nonlinear optimizer problem or as a convex optimization problem such as a geometric program or a linear program. To solve the general nonlinear optimization problems resulting in analog design, classic numerical optimization methods, such as steepest descent, sequential quadratic programming, and Lagrange multiplier methods have been used. Also, various known general purpose optimization codes, and other Computer-Aided-Design (CAD) methods for analog and mixed-signal circuit design based on classical optimization methods, may be used. Still other equation-based methods for custom digital circuit design are used (either generally nonlinear or convex), including for the purpose of gate sizing and design of ground-power networks.

Geometric programming is a type of equation-based method for identifying circuit parameters in a custom circuit design. This method has been widely used, for example, in transistor and wire sizing for Elmore delay minimization in digital circuits. Generally, a geometric program involves minimizing posynomial functions subject to posynomial and monomial constraints to provide a set of specific optimized design parameters. Advantageously, a number of commercially available programs exist for efficiently solving complex optimization programs in geometric form. Such programs include, for example, MOSEK. There are also some publicly available solvers for solving geometric programs.

A geometric program can be reformulated as a convex optimization program by changing variables and by considering the logarithms of the functions involved. A convex optimization method is a type of equation-based method that solves a special type of optimization problem—namely, a convex optimization problem. In this method, the circuit requirements and performance are described by a set of analytical design equations that have a special form. Once in this form, the design problem can be transformed into a convex optimization problem. This type of mathematical optimization problem can be solved globally very efficiently, even when the problems are large scale and nonlinear. The fact that one can solve large scale, nonlinear convex optimization problems is advantageous in many instances because it can potentially take thousands of highly nonlinear equations to accurately predict the performance of a complex block, like a phase-locked loop (PLL) or data converter.

Even though the convex optimization method is just a special type of equation-based method, it does not necessarily suffer from the traditional accuracy problem of existing equation-based methods. In particular, even though the type of equations that can be used is restricted (i.e., the equations must be convex) they can still be highly nonlinear and complex and can be used to represent intricate circuit behavior.

One very great advantage of convex optimization, compared to general purpose optimization methods, is that the global solution is always found, regardless of the starting point. Also, infeasibility is unambiguously detected. That is, if the methods used do not produce a feasible circuit-based solution, they may produce a certificate that proves that the problem is infeasible. When the geometric program is solved, a complete sensitivity analysis of the problem may also be obtained without any additional computational effort. These sensitivity numbers may provide extremely useful design insight.

Another important practical advantage with convex optimization problems is that they may be solved very efficiently. In the last decade, powerful interior-point methods for solving general convex optimization problems have been developed. These methods can solve large problems, with tens of thousands of variables and hundreds of thousands of constraints, very efficiently (e.g., in a few minutes on a modern PC). Problems involving tens of variables and hundreds of constraints are considered small, and can typically be solved on a modern PC in less than one second.

In order for a designer to use convex optimization methods, the designer is necessarily restricted in the type of equations that can be used to describe the problem. However, in circumstances where the method can be applied, great algorithmic benefits are available. Even though the circuit designer is restricted to using a convex formulation, the method can be applied to a wide variety of circuit design problems.

Various shortcomings for existing equation-based methods, including geometric programming and convex optimization methods, are widely evident. For example, using geometric programming to produce a convex problem, the circuit device models must be approximated in posynomial format. Where, as presently, simple design parameters are used as variables in the posynomial functions identifying the performance specifications associated with the geometric or convex optimization program, such as in the method disclosed in U.S. Pat. No. 6,269,277 issued to Hershenson et al., extra errors are introduced. As an illustration, these errors may become significantly pronounced in deep submicron CMOS processes. The geometric programming method is typically not accurate for transistors having a small channel length, where channel length modulation, body-effect, drain-induced barrier lowering, vertical field mobility degradation, and other non-idealities complicate the equations for the transistor parameters As another example, transistors operating in the subthreshold or weak inversion regions of operation cannot be modeled accurately using geometric programming methods. Numerous other examples exist in circuit design where design parameters cannot be accurately optimized where the equation-based method is limited to geometric programming form using simple design parameters.

Yet another shortcoming of geometric programming based methods is that general linear constraint functions cannot be used. In particular, geometric programming is limited to posynomial inequality and monomial equality constraints. This characteristic of geometric programming results in several practical disadvantages in the realm of circuit design. For example, the first step in almost all analog circuit design problems is to determine an appropriate direct current (DC) operating point. Kirchoff's Voltage Law (KVL) and Kirchoff's Current Law (KCL) assist the engineer in algebraically solving for this DC operating point. These two basic laws which govern almost all analog circuits, however, typically result in posynomial equality constraints, and thus cannot be handled using geometric programming.

Accordingly, a need exists in the art for an efficient equation-based method to be used in any circuit design problem for accurately modeling a wide variety of design parameter types under a wide variety of circuit conditions.

SUMMARY OF INVENTION

In one aspect of the present invention, a method to optimize a circuit having components characterized by one or more design parameters includes: generating a posynomial function $f$ including an exponent of a first design parameter, the posynomial function for use in a performance specification for the circuit; providing one or more constraint values for the performance specification; generating a convex optimization problem including the performance specification; and solving the convex optimization problem to produce one or more optimized design parameter values for the circuit.

In another aspect of the present invention, a method to design and optimize a circuit having components characterized by one or more design parameters includes: generating a linear function $g^1$ including a first design parameter and a posynomial function $f$ including an exponent of the first design parameter, the linear and posynomial functions for use in performance specifications for the circuit; providing constraint values for the performance specifications; generating a convex optimization problem including the functions identifying the performance specifications; and solving the convex optimization problem to produce one or more optimized design parameter values for the circuit.

In yet another aspect of the present invention, a method to design a circuit having components characterized by design parameters includes the steps of: formulating an optimization problem comprising an objective function $f_0(x_1,x_2)$ subject to constraint functions $f$ posynomial on $e^{x_1}$ and $x_2$, and $g^1$ linear on $x_1$, wherein $x_1$ and $x_2$ include design parameters and wherein $f_0(x_1,x_2)$ can take the form of any of the constraint functions; converting the optimization problem into a convex problem; and solving the convex problem to obtain optimized design parameter values for $x_1$ and $x_2$.

In yet another aspect of the present invention, computer-readable media embodying a program of instructions executable by a computer program to perform a method to optimize a circuit having components characterized by one or more design parameters includes: generating a posynomial function $f$ including an exponent of a first design parameter, the posynomial function for use in a performance specification for the circuit; providing one or more constraint values for the performance specification; generating a convex optimization problem including the performance specification; and solving the convex optimization problem to produce one or more optimized design parameter values for the circuit.

In yet another aspect of the present invention, a method of designing and optimizing a circuit having components including design parameters $x_1$ and $x_2$ includes: formulating an optimization problem including an optimization function $f_o$ subject to constraint functions including $f$ posynomial on $e^{x_1}$ and $x_2$ and h log-convex on $x_1$ and log $x_2$, wherein $f_0$ can take the form of any of the $f$ and h; converting the optimization problem into a convex optimization problem; and solving the convex optimization problem to obtain at least one optimized design parameter value.

In yet another aspect of the present invention, a method to optimize a circuit includes: producing constraint functions including $f$ posynomial on $e^{x_1}$ and $x_2$ and h log-convex on $x_1$ and log $x_2$, wherein $x_1$ and $x_2$ include design parameters of one or more components of the circuit; and solving the convex optimization problem to produce optimized design parameter values.

In still another aspect of the present invention, computer-readable media embodying a program of instructions executable by a computer program to perform a method to optimize a circuit includes: producing constraint functions comprising $f$ posynomial on $e^{x_1}$ and $x_2$ and h log-convex on $x_1$ and log $x_2$, wherein $x_1$ and $x_2$ include design parameters of one or more components of the circuit; and solving the convex optimization problem to produce optimized design parameter values.

In still another aspect of the present invention, a method to optimize a circuit having components characterized by one or more design parameters includes: formulating a problem for optimizing $s_0$ subject to a signomial function s including an exponent of a first design parameter and a log-convex function h including the first design parameter and a logarithm of a second design parameter, wherein $s_0$ can take any of the form of the s or h; approximating the optimization problem as a log-convex-linear problem-restricted (LCLP-R) problem in standard form; and solving the LCLP-R problem in convex form.

In still another aspect of the present invention, a method to optimize a circuit having components characterized by one or more design parameters includes: formulating a problem for optimizing $s_0$ having at least one term with a negative coefficient and subject to a log-convex function h, wherein $s_0$ can take the form of the h; approximating the optimization problem as a log-convex-linear problem-restricted (LCLP-R) problem in standard form; and solving the LCLP-R problem in convex form.

In still another aspect of the present invention, computer-readable media embodying a program of instructions executable by a computer program to perform a method to optimize a circuit having components characterized by one or more design parameters includes: formulating a problem for optimizing $s_0$ subject to a signomial function s including an exponent of a first design parameter and a log-convex function h includes the first design parameter and a logarithm of a second design parameter, wherein $s_0$ can take any of the form of the s or h; approximating the optimization problem as a log-convex-linear problem-restricted (LCLP-R) problem in standard form; and solving the LCLP-R problem in convex form.

In still another aspect of the present invention, a method to optimize a circuit using convex optimization with at least one design parameter includes: minimizing an objective function $f$, wherein the $f$ is posynomial on an exponent of the design parameter; and solving the $f$ to obtain at least one optimized design parameter value.

Other embodiments of the present invention will become readily apparent to those skilled in the art from the following detailed description, wherein it is shown and described only certain embodiments of the invention by way of illustration. As will be realized, the invention is capable of other and different embodiments and its several details are capable of modification in various other respects, all without departing from the spirit and scope of the present invention. Accordingly, the drawings and detailed description are to be regarded as illustrative in nature and not as restrictive.

BRIEF DESCRIPTION OF THE DRAWINGS

Aspects of the present invention are illustrated by way of example, and not by way of limitation, in the accompanying drawings, wherein.

DETAILED DESCRIPTION OF ILLUSTRATIVE EMBODIMENTS

Figure 1:
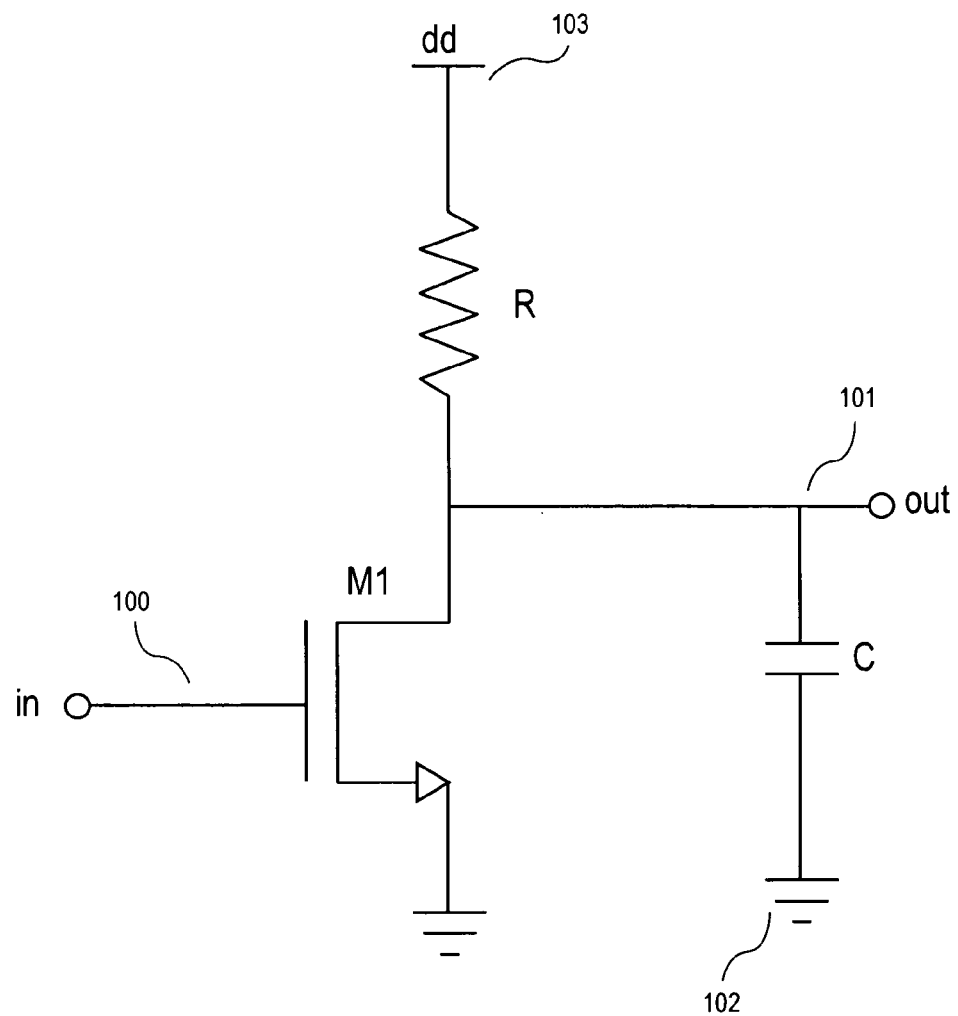
FIG. 1 is a schematic illustration of a common-source MOS amplifier.

The detailed description set forth below in connection with the appended drawings is intended as a description of various embodiments of the present invention and is not intended to represent the only embodiments in which the present invention may be practiced. Each embodiment described in this disclosure is provided merely as an example or illustration of the present invention, and should not necessarily be construed as preferred or advantageous over other embodiments. The detailed description includes specific details for the purpose of providing a thorough understanding of the present invention. However, it will be apparent to those skilled in the art that the present invention may be practiced without these specific details. In some instances, well-known structures and devices are shown in block diagram form in order to avoid obscuring the concepts of the present invention.

In one aspect of the present invention, the exponents of design parameters are used. For the purposes of this disclosure, the "exponent of a design parameter" x means $e^x$. For example, the voltage variables of a circuit design problem may be transformed into the exponents of the voltage variables. That is, the exponent of voltage V refers for the purposes of this disclosure to the quantity $e^v$. Accurate transistor models using standard design parameters (e.g., W, L, and $I_{ds}$) as well as the exponential transformation of the design parameters (e.g., $e^{V_{gs}}$, $e^{V_{ds}}$, and $e^{V_{sb}}$) may be generated in a format compatible with convex optimization. Doing so allows a circuit design problem to be cast as a convex optimization problem without effectively restricting the type of problems that can be cast in such form (unlike the methods described above). These methods are also efficient in that they can be solved quickly and effectively.

The variable transformation makes it possible to construct linear equality and inequality constraints in terms of transistor-based voltages $V_{gs}$, $V_{ds}$, and $V_{sb}$ while maintaining the convexity of the optimization problem. Doing so allows the circuits constraints created using Kirchoff's Voltage Law to be handled naturally and efficiently by the optimization, a property that is not true of existing convex optimization methods. Another advantage to transforming the device voltages to the exponentials of the voltages (or exponents of other variables) is that the accuracy of the transistor models may be dramatically increased. These advantageous properties are discussed in more detail below. One resulting advantage is that more that one region of operation can be modeled simultaneously, while still maintaining the accuracies needed for circuit design.

The accuracy of a number of transistor small and large signal parameters is improved using the methods of the present invention. A few examples illustrating this fact are now shown. First, the following equation is considered:

$$I_{ds} = \frac{\mu C_{ox}}{2} \frac{W}{L}(V_{gs} - V_t)^2(1 + \lambda V_{ds}) \quad (1.1)$$

The long-channel drain current of a MOS transistor is shown in equation (1.1), including the effects of channel length modulation. In order to incorporate the fact that the drain current increases slightly with $V_{ds}$, the $1+\lambda V_{ds}$ is added. The increase in current is a second-order effect, so $\lambda V_{ds}$ is almost always much less than one. Applying Taylor series, we know that $e^x \approx 1+x$ for small x, and therefore, $1+\lambda V_{ds} \approx e^{\lambda V_{ds}}$ for small $\lambda V_{ds}$. Using the exponential transformation for $V_{ds}$ allows the channel length modulation to be modeled naturally in a convex, monomial form.

Vertical field mobility degradation prevalent in modern CMOS processes reduces the ideal drain current of a MOS transistor in a similar manner. The drain current taking vertical field mobility degradation into account is: $I_{ds}=I_{ds,ideal}(1+\beta_g V_{ds})^{-1}$. Again applying the Taylor series approximation, $(1+\beta_g V_{gs})^{-1} \approx e^{\beta_g V_{gs}}$ for small $\beta_g V_{gs}$. Using the exponential transformation for $V_{gs}$ allows the vertical field mobility degradation to be modeled naturally in monomial form.

The parasitic diode capacitances resulting from the source and drain diffusion regions represent another example where the exponential transformation allows accurate convex models to be generated. For example, the source to bulk capacitance of the reverse-biased source diffusion diode is:

$$C_{sb} = AS\frac{C_j}{\sqrt{1+\gamma V_{sb}}} + PS\frac{C_{jsw}}{\sqrt{1+\gamma V_{sb}}}.$$

Using the same Taylor series approximation, it is clear that $\sqrt{1+\gamma V_{sb}} \approx e^{0.5\gamma V_{sb}}$ for small $\gamma V_{sb}$. Again, an accurate model compatible with convex optimization methods is generated using the exponential transformation of the device voltages. To contrast this method to traditional optimization methods, consider $C_{sb}$ as a monomial function of $V_{sb}$, that is, $\alpha V_{sb}^\beta$. Notice that as $V_{sb}$ approaches zero, the capacitance either goes towards zero or infinity, depending on the sign of $\beta$. Therefore, it is clear that traditional convex optimization models directly using the design variables $V_{ds}$ and $V_{sb}$ result in erroneous values for the design parameters.

Note that $C_{db}$ may be calculated in the same manner as $C_{sb}$, using $e^{(V_{ds}+V_{sb})}$ instead of $e^{V_{sb}}$. Notice further that the linear combination of $V_{ds}$ and $V_{sb}$ (computed using KVL) is needed to accurately compute $C_{db}$. This computation is not possible using the existing methods in geometric programming.

$C_{sb}$ and $C_{db}$ can also take advantage of the new LCLP-R convex optimization technique introduced in this specification. The Taylor Series approximation can introduce some error in $C_{sb}$ and $C_{db}$ when $V_{sb}$ and $V_{db}$ are large. Referring to equation (15) (see below), with $x_1 = 1+\gamma V_{sb}$ and $b_k = 0.5$, the error introduced in the Taylor Series approximation of $C_{sb}$ and $C_{db}$ can be eliminated, while still retaining the beneficial log-convex properties of the log-convex-linear restricted (LCLP-R) optimization problem (described in detail below). Notice also that the form of the $C_{sb}$ equation, above, can be applied to any semiconductor junction capacitance.

The weak inversion and subthreshold regions of operations cannot be accurately modeled using traditional convex optimization methods. Typically, with existing solutions, only the strong inversion region of operation may be modeled under some circumstances with a reasonable degree of accuracy. With power supply voltages dropping and power consumption becoming a major problem with circuit design, it behooves the designer to take advantage of the low current and low gate-source voltages applied to bias the transistor in the weak inversion or subthreshold region of operation. It is well known that in the subthreshold region, the drain current of the transistor is dominated by diffusion current. Therefore, the equation describing the drain current of a MOS transistor in the subthreshold region is analogous to the emitter current of a Bipolar Junction Transistor (BJT), as shown in the following equations:

$$I_{ce} = I_s e^{\frac{V_{be}}{V_{th}}}$$

$$I_{ds} = I_{s,sub} e^{\frac{V_{gs}}{V_{th}}}$$

Both the emitter current of a bipolar transistor and the drain current of a MOS transistor in the subthreshold region of operation are modeled exactly using the exponential transformation of the device voltages. The drain current in the weak inversion region is somewhere between the exponential dependence on $V_{gs}$ and the square-law dependence on $V_{gs}$ of the long-channel MOS transistor in the strong inversion region.

Figure 10:
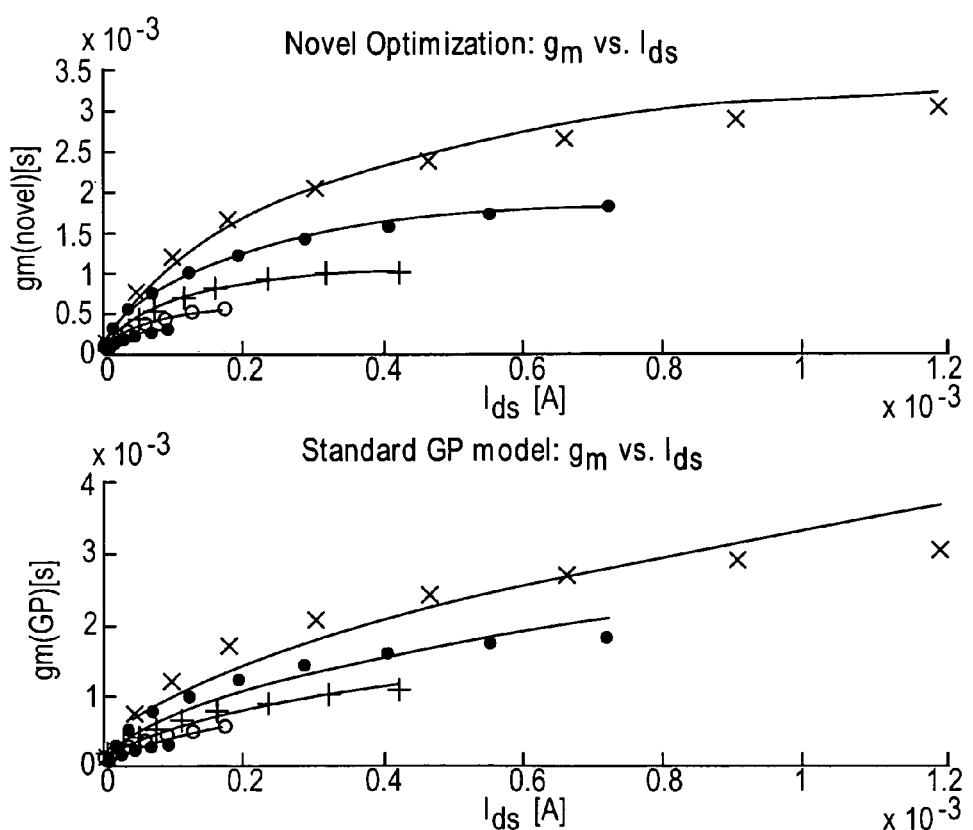
FIG. 10 is a graph depicting the transconductance versus the drain current of a MOS transistor in saturation operating in both weak and strong inversion regions of operation in accordance with an embodiment of the present invention.

Using $e^{V_{gs}}$, accurate models for $I_{ds}$, $g_m$, $g_{ds}$, $C_{gs}$, and other important transistor parameters can be generated that are accurate over multiple regions of transistor operation. The performance of a circuit can be dramatically improved by eliminating the existing restrictions on the region of operation of the transistors. However, unlike previously proposed solutions, these improvements are realized with an optimization method that is convex, saving a significant amount of time and enabling for a far more efficient and reliable solution. The comparison of the $g_m$ models in FIG. 10 using the optimization methods of the present invention, versus the more traditional geometric programming based methods highlights the improved accuracy of the models.

Models for a Generic Circuit Design Problem. As an illustrative framework for the various embodiments of the present invention that follow, exemplary types of analytical models used in describing a generic circuit design problem will first be summarized. Typical design variables in a circuit design problem include:

Active and passive device sizes ($S_i$) (e.g., transistors, resistors, wires, etc. . . . )

Circuit variables (node voltages $V_i$ and branch currents $I_i$)

External circuit parameters ($X_i$) (e.g., supply voltage and bias currents)

Referring to FIG. 1, an exemplary common source amplifier is shown. The amplifier includes transistor M1, resistor R, and capacitor C. Input node 100 is at the gate of transistor M1. Output node 101 resides at the drain of transistor M1. A capacitor C is also coupled to node 101. The source of transistor M1 and other terminal of capacitor C is coupled to a ground node 102. A resistor R is coupled between output node 101 and power node 103.

The amplifier of FIG. 1 is instructive in understanding that equations that describe circuit behavior can be classified into at least four categories. The first category includes operating point equations (e.g., a bias point in an analog circuit). Within this category, Kirchoff's voltage law (KVL) gives rise to linear equations on voltages $$f_{KVL}(V_i)=0$$

For example, given the common-source amplifier illustrated in FIG. 1, the following two equations arise:

$$V_{DD}=V_R+V_{D,M1} \tag{1}$$

$$V_{in}=V_{G,M1}, \tag{2}$$

where $V_R$ represents the voltage drop across resistor R, $V_{D,M1}$ is the drain voltage of transistor M1, and $V_{G,M1}$ is the gate voltage of transistor M1. Equations (1) and (2) are linear equations in terms of node voltages ($V_{G,M1}$ and $V_{D,M1}$).

The first category (operating point equations) also includes applications of Kirchoff's current law (KCL) that give rise to linear equations on currents $$f_{KCL}(I_i)=0$$

For example, in the circuit of FIG. 1, the following equation would apply:

$$I_{DS,M1}=I_R, \tag{3}$$

where $I_{DS,M1}$ is the transistor current and $I_R$ is the resistor current. Again, note that equation (3) is a linear equation in the device currents.

The second category includes nonlinear devices that give rise to nonlinear equations which describe the relationship between their terminal voltages, currents, and sizes:

$$f_{NL}(V_i,I_i,S_i)=0.$$

Many types of non-linear devices exist in circuit design. Examples include, among others, metal-oxide-semiconductor (MOS) transistors, bipolar junction transistors, and non-linear capacitors. A simplified equation for defining the characteristics of a bipolar junction transistor in the active region of operation is:

$$I_C = I_s e^{\frac{V_{BE}}{V_T}} \left(1 + \frac{V_{CB}}{V_A}\right), \tag{4}$$

where $I_C$ is the collector current, $I_S$ is the saturation current which depends on the collector area, $V_{BE}$ is the base-to-emitter voltage, $V_T$ is the thermal voltage, $V_{CB}$ is the collector-to-base voltage and $V_A$ is the Early voltage. Equation (4) is a nonlinear equation involving device terminal voltages, currents, and sizes.

As another illustration, the equation for a long-channel CMOS transistor in the saturation region of operation is $$I_D=k(V_{GS}-V_t)^2(1+\lambda V_{DS}), \tag{5}$$

where $I_D$ is the drain current, k is a process and size dependent variable, $V_{GS}$ is the gate-to-source voltage, $V_t$ is the transistor's threshold voltage, $\lambda$ is a process constant and $V_{DS}$ is the drain-to-source voltage.

The third category includes linear devices that give rise to linear equations which describe the relationship between their terminal voltages, currents and sizes:

$$f_L(V_i,I_i,S_i)=0.$$

Many devices exist whose behavior (under certain circumstances) may be very well modeled using linear equations. Such devices include, for example, resistors, capacitors, and inductors in cases where certain values are fixed. For a simple ideal resistor, ohm's law applies:

$$V_R=I_R R. \tag{6}$$

where equation (6) represents a linear relationship between resistor voltage and current for a fixed resistor size.

The fourth category includes circuit design parameters that can be modeled as nonlinear equations of the design variables (in some cases, these equations can be linear):

$$f_{CKT}(V_i,I_i,S_i).$$

Many circuit design parameters exist. Some of these parameters constitute properties of the devices themselves (e.g., the transconductance $g_m$ for a transistor); still others represent circuit specifications (e.g., gain of an amplifier). Generally, the specifications are circuit dependent. For example, in designing an amplifier one might be interested in parameters such as power, unity-gain bandwidth, open-loop gain, phase margin, and other design parameters. In designing a logic gate, one might be more interested in parameters such as rise time, fall time, power, etc. Design parameters may be independent or dependent. For example, the design parameter of amplifier gain may in some cases be dependent on (i.e., a function of) one or more independent design parameters, such as a transistor width (W). As an example, for the simple common-source amplifier of FIG. 1, some of the design parameters are $$P = V_{DD} I_R \quad (7)$$

$$|G| = g_m R, \quad \text{and} \quad (8)$$

$$\omega_{3dB} = \frac{(R + r_0)}{(R)(r_0)C_D} \quad (9)$$

where p is the power, |G| is the absolute gain, $\omega_{3\,dB}$ is the 3 dB frequency, $r_o$ is the small-signal transistor output resistance, and $C_D$ is the total capacitance at the drain node.

In summary, a circuit design problem can be generically written as an optimization problem where we minimize a circuit performance parameter subject to limits on other design parameters. For example, minimize $f_{CKT,0}(V_i, I_i, S_i)$ subject to $f_{CKT,i}(V_i, I_i, S_i) \leq P_i, i=1, \ldots, p$, $f_{KVL}(V_i)=0, i=1, \ldots, n_v$, $f_{KCL}(I_i)=0, i=1, \ldots, n_i$, $f_{NL}(V_i, I_i, S_i)=0, i=1, \ldots, n_m$, $f_L(V_i, I_i)=0, i=1, \ldots, n_r$, $S_i > 0, i=1, \ldots, n$, (10)

where $P_i$ is the required specification for performance i, p is the number of performance specifications, $n_v$ is the number of loops in a circuit, $n_i$ is the number of branches in a circuit, $n_m$ is the number of equations representing the behavior of non-linear devices, $n_r$ is the number of equations representing the behavior of linear devices, and n is the number of physical variables. Notice that the performance specification (constraint) functions include a function of some variable limited by or equaling some constraint value.

As can be seen, most circuit design problems are described by a mixture of linear and nonlinear equations in the design variables. As a result, an optimization problem to design a circuit may contain both linear and nonlinear equations. In order to solve this problem, one can use a general-nonlinear optimization solver. As known in the art, such an approach has numerous drawbacks and can be very difficult, if not impossible, to solve. Issues with general nonlinear non-convex optimization problems include local minima, indetermination of feasibility, starting point dependence, long optimization times, etc.

Figure 2:
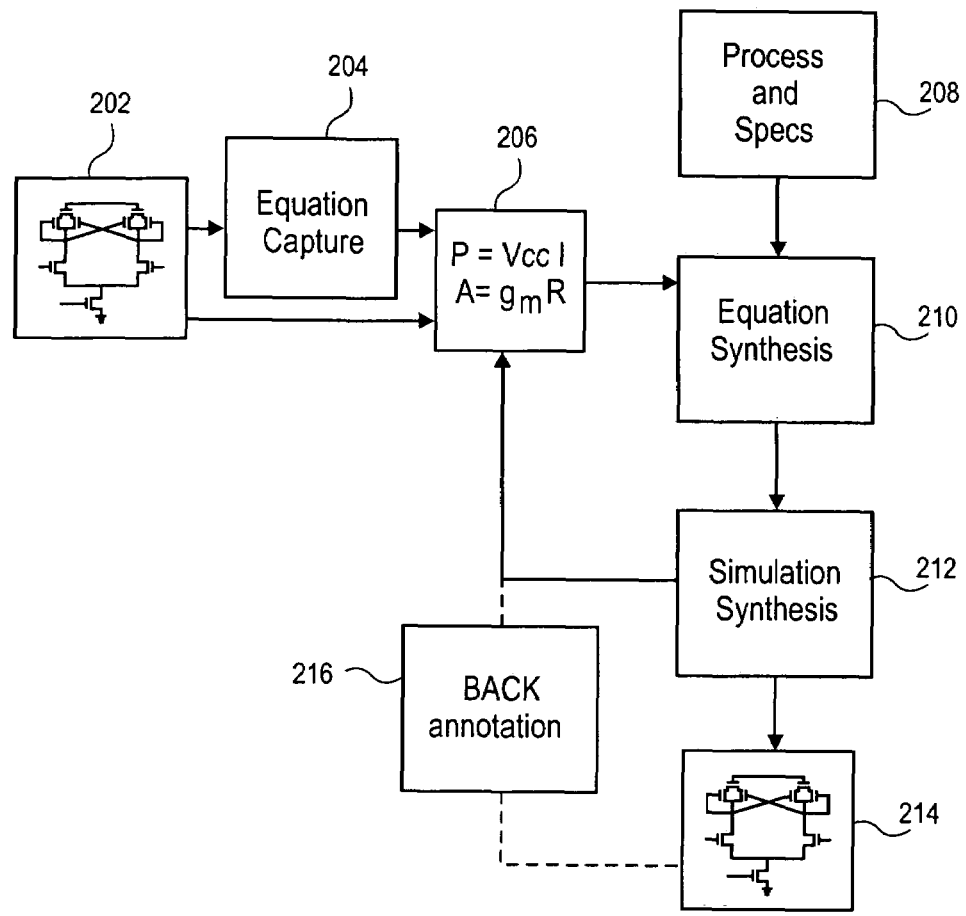
FIG. 2 is a flow diagram for an exemplary circuit design methodology.

Circuit Design Methodology. FIG. 2 shows an exemplary circuit design methodology. As illustrated by block 202, an appropriate circuit schematic is first generated. In step 204, an automatic equation capture is performed wherein the equations specific to the circuit selected in 202 are generated. In addition or as an alternative to the automatic equation capture of step 204, a manual equation creation step may be included, as illustrated by 206.

In step 208, data relating to the fabrication process and other pertinent design specifications may be provided. In addition, "pre-annotated" data may be provided in step 208 to establish a basic framework for the equation-based synthesis. For example, layout information and yield information may be provided. This information may take various forms, such as the inclusion of capacitance estimations of the device parasitics, statistical information on process parameters, and the like.

Thereupon, with the equations defined and the process and design data provided, the equation-based synthesis of step 210 may occur. Step 210 may, for example, include equation-based circuit sizing and calculation of other relevant design parameters. In addition, simulation methods may be used as illustrated in step 212. These simulation-based methods may augment the equation-based methods. In many instances, an optimal solution for a custom circuit design problem may combine both equation and simulation-based methods. A reasonable effort may be invested in modeling the circuit at issue using equations. Likewise, simulation may be used in a guided manner to either create equations for the circuit, or to fine-tune a design, etc.

Upon a determination of an initial set of design parameters based on steps 210 and 212, a resulting circuit (as shown in 214) may be produced. The properties and parameters of that circuit may be used in a "back annotation" step 216 to run through the process again, to tweak the design as necessary and appropriate.

FIG. 2 represents only one of the possible methodologies for circuit design. Other approaches that combine both equation-based methods and simulation are equally possible and feasible, and do not depart from the spirit and scope of the present invention.

In one aspect of the present invention, a log convex linear problem (LCLP) includes an equation-based method for optimizing circuit parameters. As demonstrated below, the LCLP problem includes at least a circuit performance specification function that is posynomial on an exponent of a design parameter $e^x$. Design parameter x constitutes a variable that is typically some circuit parameter to be optimized. Upon solving the LCLP, an optimized design parameter value may be produced. The optimized design parameter may represent an optimal value for the design parameter x. More than one design parameter may be used, and corresponding optimized design parameter values may be computed for each of the respective design parameters. In addition, the LCLP (as described below) may include additional performance specification (constraint) functions. Optimized values may be defined for each such performance specification.

For purposes of this disclosure, design parameter variables denoted $x_1$ are generally represented in the equations that follow in terms of an exponent (namely, $e^{x_1}$), whereas design parameter variables denoted $x_2$ are generally represented as simple (non-exponential) design parameters (namely, $x_2$). This distinction is for clarity of nomenclature only, as in practical application, different terminology for the variables or additional variables may be used in describing the problem without departing from the spirit or scope of the present invention.

Consider the following optimization problem:

minimize $f_o(x_1, x_2)$ s.t. $f_i(x_1, x_2) \leq 1 \, i=1, \ldots, n_1$, $f_i^2(x_2) \leq 1 \, i=1, \ldots, n_2$, $g_i(x_1, x_2) = 1 \, i=1, \ldots, n_3$, $g_i^1(x_1)=0$  $i=1,\ldots,n_4$, $x_2 \geq 0$ (11)

where $f_i$ are posynomial on $e^{x_1}$ and $x_2$.
$f_i^2$ are posynomial on $x_2$.
$g_i$ are monomial on $e^{x_1}$ and $x_2$.
$g_i^1$ are linear on $x_1$.
$f_0$ can take any of the form $f_i$, $f_i^2$, $g_i$, or $g_i^1$.

Problem (11) is an LCLP problem in standard form.

We first describe the steps used to solve this problem, and certain other specific types of problems which fall within the scope of the present invention. Thereafter, we apply the concepts of this problem to specific circuits and devices, and describe with particularity how the methodology of this problem can be applied to accurately predict device behavior.

An LCLP problem in standard form may be transformed into a convex problem. To achieve this transformation, the following steps may be taken:

(1) Perform a change of variables $y_2 = \log x_2$
(2) Rewrite $f_0$, $f_i$, $f_i^2$, $g_i$ in terms of the new variables $y_2$
(3) Take the logarithm of the $f_0$, $f_i$, $f_i^2$, $g_i$ and define new functions:

$f_0'(x_1,y_2) = \log f_0(x_1,y_2)$ $f_i'(x_1,y_2) = \log f_i(x_1,y_2)$ $f_i^{2'}(y_2) = \log f_i^2(y_2)$ $g_i'(x_1,y_2) = \log g_i(x_i,y_2)$ The resulting problem can be written as minimize $f_o'(x_1,y_2)$ s.t. $f_i'(x_1,y_2) \leq 0$ $f_i^{2'}(y_2) \leq 0$ $g_i'(x_i,y_2) = 0$ $g_i^1(x_1) = 0$, (12)

where $f_i'$ are convex on $x_1$ and $y_2$ and are also called log-exp-posy functions of $e^{x_1}$ and $x_2$:

$$f_i' = \log\left(\sum_k^{M_{fi}} e^{\beta_k + \alpha_k^T y_2 + \gamma_k^T x_1}\right),$$

$f_i^{2'}$ are convex on $y_2$ and are also called log-exp-posy functions of $e^{x_1}$ and $x_2$:

$$f_i^{2'} = \log\left(\sum_k^{M_{fi}} e^{\beta_k + \alpha_k^T y_2}\right),$$

$g_i'$ are affine on $y_2$:

$g_i' = \beta_{gi1} + \alpha_{gi1}^T y_2 + \gamma_{gi}^T y_2 + \gamma_{gi}^T x_1$, $g_i^1$ are affine on $x_1$ (this is just a special case of previous functions):

$g_i^1 = \beta_{gi1} + \gamma_{gi}^T x_1$.

Because $f_i'$ and $f_i^{2'}$ are convex and $g_i'$ and $g_i^1$ are affine, problem (12) is convex and thus can be solved globally very efficiently using recently developed interior-point methods. Problem (12) is called an LCLP problem in convex form.

Theoretically, problem (11) can be solved instead of (12). However, problem (11) is not convex and this means that it is difficult to solve. Thus, problem (11) may be effectively solved by converting it to its convex form (as in problem (12)) and then solving the convex problem.

As demonstrated at length in this disclosure, casting the circuit optimization problem in the above form provides significant advantages over prior approaches. For example, using linear functions of certain design parameters, such as the two-terminal transistor voltages in the circuit, $x_1$ ($g^1(x_1)$) allows the designer to handle Kirchoff's voltage laws, which is not possible to do in existing geometric programming (GP) and other approaches (e.g., if we have posynomial equality constraints, the problem is not cast in geometric programming (GP) in standard form). Additionally, using $f(x_1,x_2)$ in circumstances where $f_i$ is posynomial on an exponent of $x_1$—namely, $e^{x_1}$—permits the designer to represent MOS and BJT device behavior which cannot be modeled accurately using simple posynomials of the design parameters, as in existing approaches.

The introduction of new optimization variables (namely the exponential of the design variables) allows the designer to solve many of the traditional problems associated geometric programs (such as, for example, the formulation of KVL and the modeling of many non-posynomial functions).

Note that, in equation (11), there is no need to mention the equalities $g_i$, since they are equivalent to two posynomial inequalities, i.e., $g_i=1$ is equivalent to $g_i \geq 1$, $g_i \leq 1$ and because all monomials are posynomials, we can write $g_i=1$ as two posynomial inequalities (with the $f_i$) rather than an explicit $g_i$, and the equation remains an LCLP equation in standard form.

Figure 3:
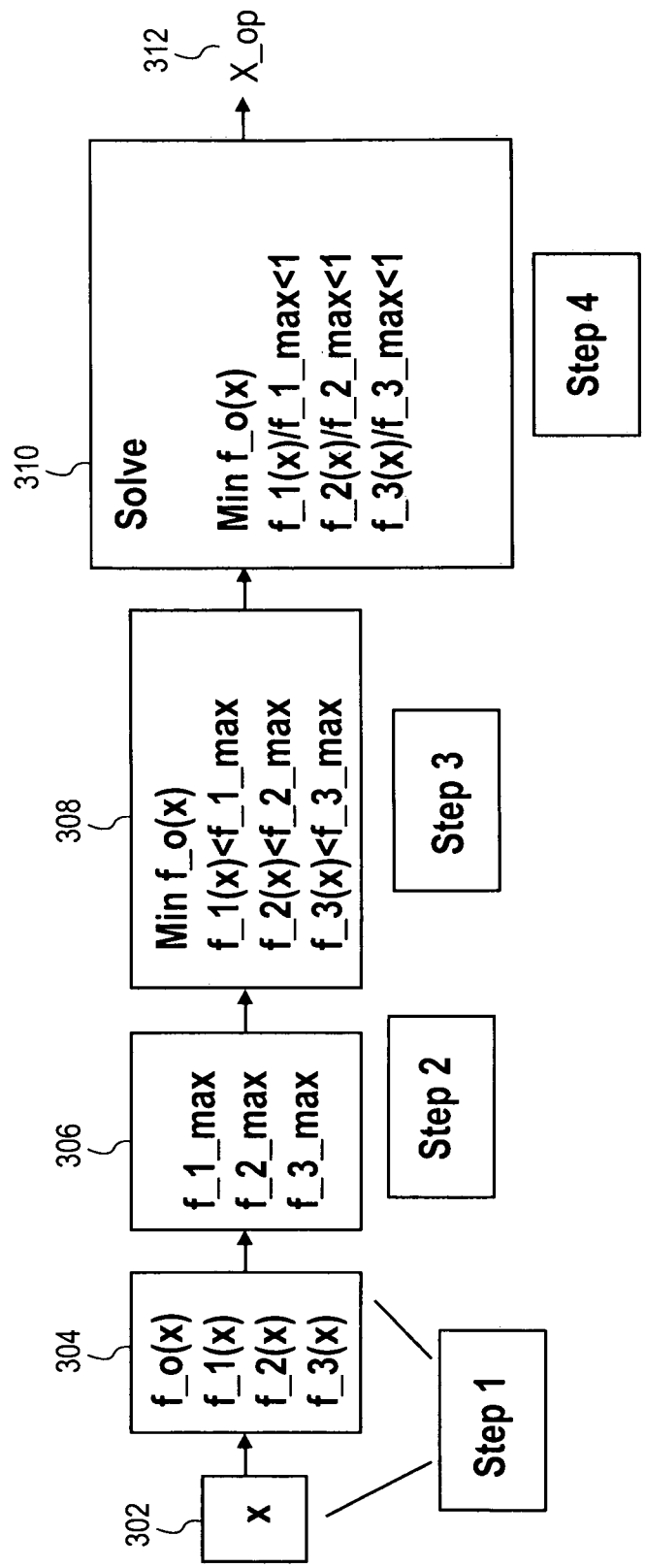
FIG. 3 is a flow diagram which illustrates the steps for setting up a log-convex linear problem in accordance with an embodiment of the present invention.

FIG. 3 is a flow diagram which illustrates the steps for a setting up a log-convex-linear problem in accordance with an embodiment of the present invention. In step one, a design parameter x representing a characteristic of a circuit (such as a voltage, a desired amplifier gain, etc.) is selected for optimization (block 302), and in this example, an objective function $f_0(x)$ and three performance specifications or constraint functions $f_1(x)$, $f_2(x)$, and $f_3(x)$ are identified (block 304). In step 2, values $f_{1,max}$, $f_{2,max}$, and $f_{3,max}$ may be defined as constraints for the performance specifications (1105). Using these functions, in step 3 (block 308), the problem is written as a generic optimization problem. In step 4 (block 310), the optimization problem is formulated as a log-convex-linear program in standard form (such as described in equation (11), above) and it is solved. In particular, the resulting problem set forth in block 310 can be transformed into a convex problem and can be solved using any number of available methods, such as, for example, an interior point method (which is implemented in the commercially available software MOSEK). Optimized design parameter value $x_{op}$ (namely, an optimized value for design parameter x) results (312).

Figure 4:
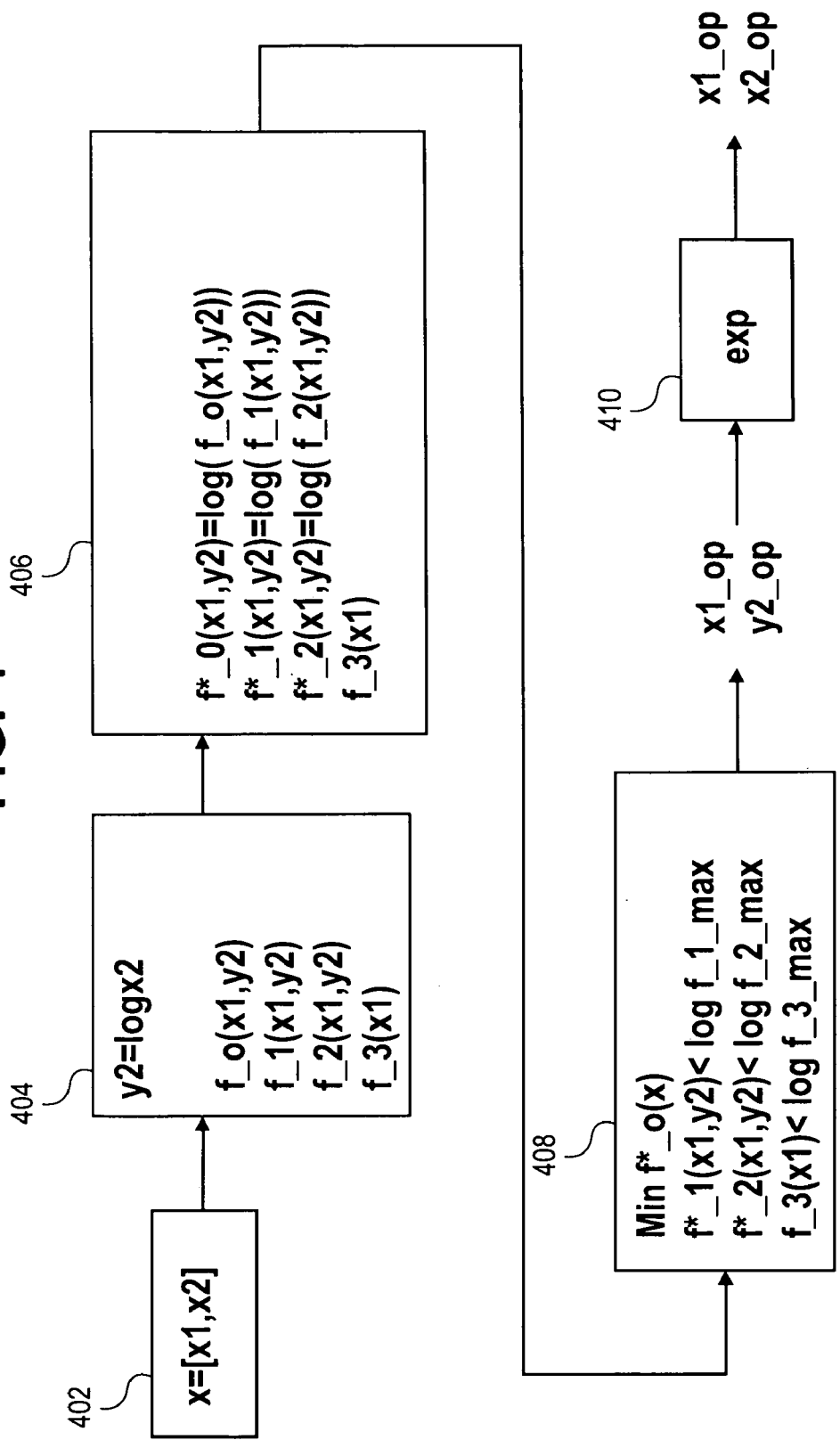
FIG. 4 is a flow diagram which illustrates the steps for solving a log-convex linear problem in accordance with an embodiment of the present invention.

FIG. 4 is a flow diagram which illustrates the steps for solving a log-convex-linear program in accordance with an embodiment of the present invention. We distinguish the design parameters into two types $x_1$ and $x_2$ (step 402). Starting with objective function $f_0(x_1,x_2)$ and the performance specifications $f_1(x_1,x_2)$, $f_2(x_1,x_2)$, and $f_3(x_1,x_2)$, we take the logarithm of $x_2$, perform a change of variables ($y_2=\log(x_2)$) and rewrite $f_0(x_1,x_2)$, $f_1(x_1,x_2)$, $f_2(x_1,x_2)$, and $f_3(x_1,x_2)$ in terms of the new variable $y_2$ (step 404). Then we proceed to take the log of all $f_i(x_1,y_2)$ that are not linear on $x_1$ (step 406) (In this example, we assume $f_3$ is linear on $x_1$). Upon defining optimization values for each of the performance specifications, the result is an LCLP problem in convex form that can be readily solved for the optimal values $x_{1,op}$ and $y_{2,op}$ (step 408). Then, in step 410, we take the exponential of $y_{2,op}$ to obtain the optimal result $x_{2,op}$ in the original variables. Note that the resulting problem in step 408 is a geometric program in convex form.

Figure 5:
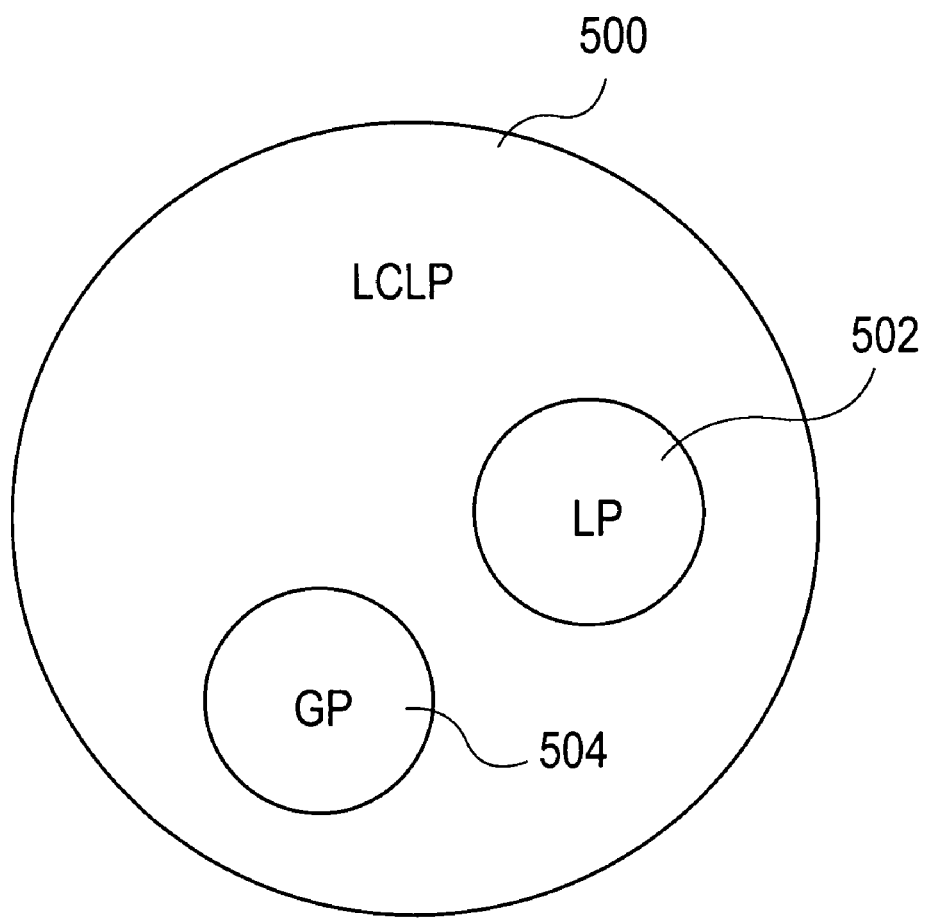
FIG. 5 is a graphical representation of the relationship between a log-convex-linear problem with geometrical and linear programming methods.

FIG. 5 is a graphical representation of the relationship between a log-convex linear problem (LCLP) 500 in standard form with geometrical and linear programs in standard form 504 and 502, respectively. The LCLP problem 500 is a special type of optimization problem which can degenerate into two well known optimization problems. The first is a geometric programming problem 504. This degeneration into a geometric programming problem can occur if the designer chooses $x_2$ variables but no $x_1$ variables (i.e., the designer does not use $e^{x_1}$ and no functions of $x_1$ variables are used). The second is a simple linear programming problem 502. This degeneration can occur if the designer chooses $x_1$ variables and not $x_2$, and only linear functions $g_i$ are found.

LCLP-R Problem. In another aspect of the invention, a restricted log-convex linear problem (LCLP-R) is disclosed. Consider now the following optimization problem minimize $f_o(x_1,x_2)$ s.t. $f_i(x_1,x_2) \leq 1$ $i=1,\ldots,n_1$, $f_i^2(x_2)=1$ $i=1,\ldots,n_2$, $g_i(x_1,x_2)=1$ $i=1,\ldots,n_3$, $g_i^1(x_1)=0$ $i=1,\ldots,n_4$, $h_i(x_1,x_2) \leq 1$ $i=1,\ldots,n_5$, (13)

where
- $f_i$ are posynomial on $e^{x_1}$ and $x_2$.
- $f_i^2$ are posynomial on $x_2$.
- $g_i$ are monomial on $e^{x_1}$ and $x_2$.
- $g_i^1$ are linear on $x_1$.
- $h_i$ are log-convex on $x_1$ and $y_2=\log x_2$ but not posynomial on $e^{x_1}$ and $x_2$.
- $f_0$ can take any of the form $f_i$, $f_i^2$, $g_i$, $g_i^1$, or $h_i$.

We call problem (13) an LCLP-R problem in standard form. Unlike the LCLP problem in standard form, the restricted problem includes a performance specification function $h_i$ which is log-convex on $x_1$ and $y_2=\log x_2$. An LCLP-R problem in standard form can also be transformed into a convex problem. To do this, we take the following steps:

Consider a change of variables $y_2=\log x_2$

Rewrite $f_0, f_i, f_i^2, g_i, h_i$ in terms of the new variables $y_2$

Take the logarithm of the $f_0, f_i, f_i^2, g_i$, and $h_i$ and define new functions $f_0'(x_1,y_2)=\log f_0(x_1,y_2)$ $f_i'(x_1,y_2)=\log f_i(x_1,y_2)$ $f_i^{2'}(y_2)=\log f_i^2(y_2)$ $g_i'(x_1,y_2)=\log g_i(x_1,y_2)$ $h_i'(x_1,y_2)=\log h_i(x_1,y_2)$ Then, the problem becomes, minimize $f_o'(x_1,y_2)$ s.t. $f_i'(x_1,y_2) \leq 0$ $f_i^{2'}(y_2)=0$ $g_i'(x_1,y_2)=0$ $g_i^1(x_1)=0$ $h_i'(x_1,y_2) \leq 0$, (14)

where
$f_i'$ are convex on $x_1$ and $y_2$ and have been described in the previous section.

$f_i^{2'}$ are convex on $y_2$ and have been described in the previous section.

$g_i'$ are affine on $y_2=\log x_2$ and have been described in the previous section.

$g_i^1$ are affine on $x_1$ and have been described in the previous section.

$h_i'$ are convex on $x_1$ and $y_2$. There are many choices of convex functions $h_i'$, each of which fall within the scope of the present invention, but a useful convex function for circuit design applications is the following, $$h_i' = \log\left(\sum_k^{M_h} e^{\beta_k + \alpha_k^T y_2 + \gamma_k^T x_1} x_1^{-b_k}\right) \quad (15)$$

where $b_k > 0$.

To prove that $h_i'$ is a convex function, we show that $h_i$ can be written as the log of a sum of log-convex functions $$\left(h_i' = \log\left(\sum_k h_{i,k}\right)\right)$$

and thus is convex. First we consider one of the terms in the sum:

$h_{i,k} = e^{\beta_k + \alpha_k^T y_2 + \gamma_k^T x_1} x_1^{-b_k}$.

We take the logs, $\log(h_{i,k}) = \beta_k + \alpha_k^T y_2 + \gamma_k^T x_1 - b_k \log x_1$, and we see that $\log(h_i)$ is convex in $x_1$ and $y_2$ (it is a sum of an affine function ($\beta_k + \alpha_k^T y_2$) and a convex function ($-b_k \log x_1$)). Note that it is important that $b_k$ are non-negative. Since $h_{i,k}$ are log-convex, $h_i'$ are convex.

There are numerous other possibilities for $h_i'$. For example, one can just simply write $$h_i' = \log\left(\sum_k^{M_h} e^{\beta_k + \alpha_k^T y_2 + \gamma_k^T x_1} \prod_i^{n_x} (a_{k,i} + c_{i,k} x_{1,i})^{-b_{k_j}}\right) \quad (16)$$

with $b_k \geq 0$. Note that we distinguish the $h_i'$ functions from the $f_i'$ functions in that the $h_i'$ functions are not log-exp-posy functions in any variables.

Since $f_i'$, $f_i^{2'}$ and $h_i'$ are convex and $g_i'$ and $g_i^1$ are affine, problem (14) is convex and thus can be solved globally very efficiently using recently developed interior-point methods. We call problem (14) an LCLP-R problem in convex form.

Problem (13) is not convex and this means that it is difficult to solve. Thus, if we want to solve problem (13), it is crucial to convert it to its convex form—as shown in problem (14). Then, solving the LCLP-R problem in convex form is straightforward using one of a number of known methods.

Figure 6:
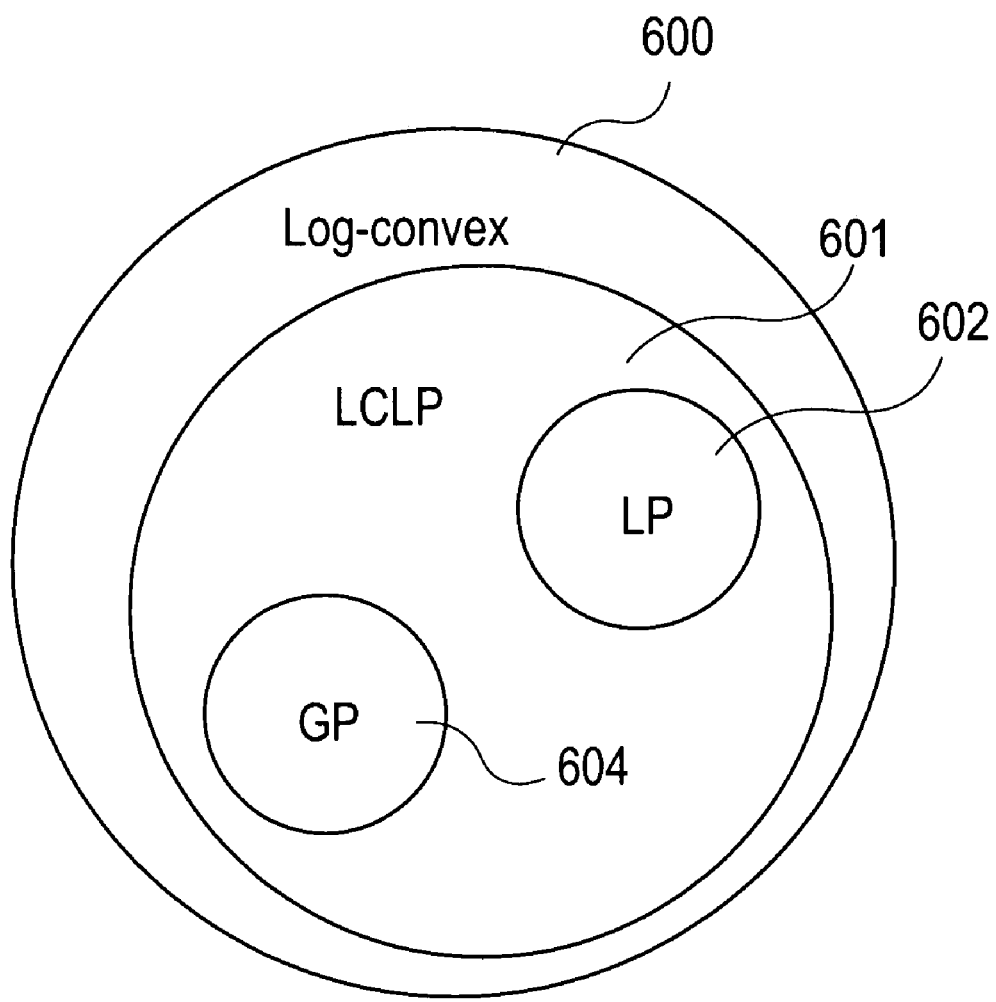
FIG. 6 is a graphical representation of the relationship between a log-convex problem, and LCLP problem, and geometrical and linear programming problems.

FIG. 6 is a graphical representation of the relationship between a log-convex problem 600, an LCLP problem 601, and geometrical and linear programming problems 604 and 602, respectively. The log-convex problem 600 degenerates into an LCLP problem 601 where the designer does not include a general log-convex function $h_i$. The problem described above is an LCLP problem 601 in connection with an embodiment of the present invention, which is a type of log-convex problem 600. The LCLP problem 601 can further degenerate into a geometrical problem 604 or linear problem 602 under the conditions described in connection with FIG. 5, above.

Figure 11:
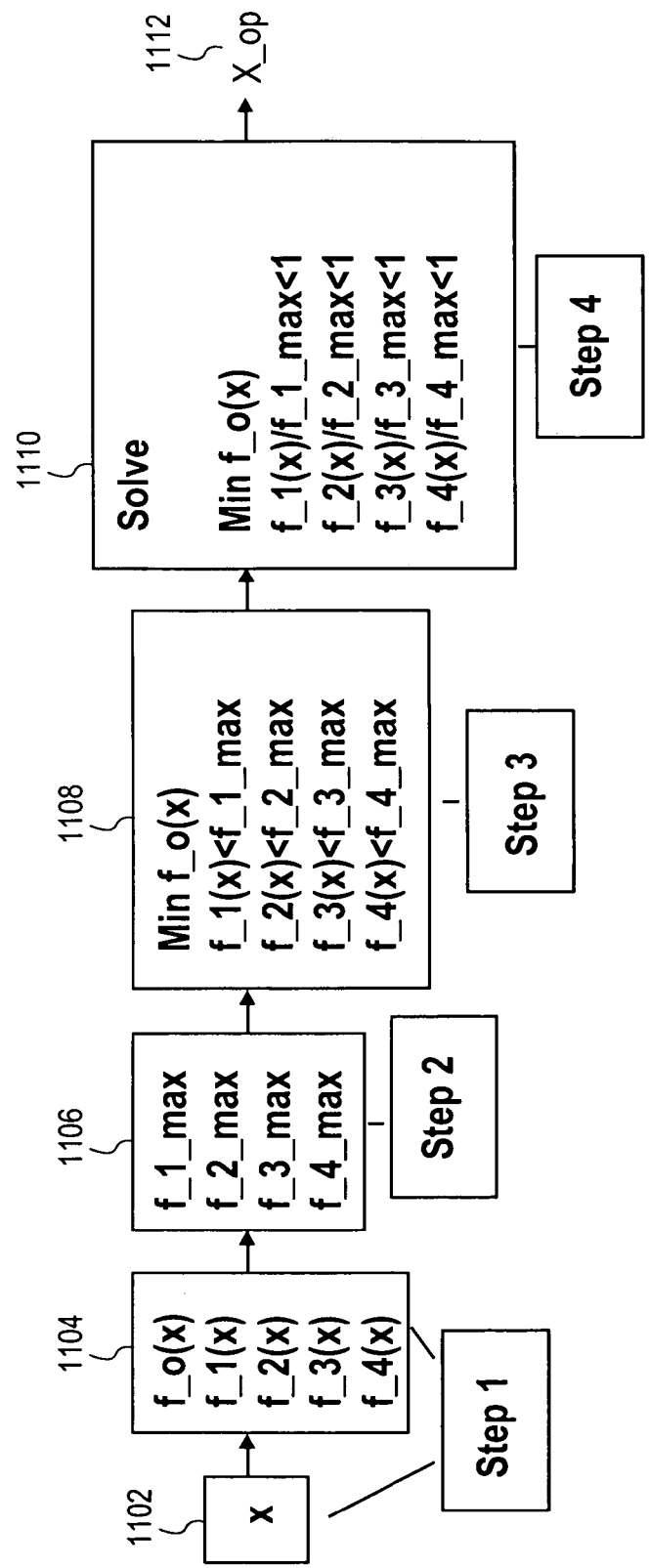
FIG. 11 is a flow diagram of a log-convex linear restricted (LCLP-R) problem in accordance with an embodiment of the present invention.

FIG. 11 is a flow diagram describing a generic LCLP-R problem. In step 1, a design parameter x is selected (1101), and the problem is written as a generic optimization problem for minimizing $f_0(x)$ (1104) subject to exemplary performance specifications $f_1(x)$, $f_2(x)$, $f_3(x)$, and $f_4(x)$. In step 2, values $f_{1,max}$, $f_{2,max}$, $f_{3,max}$, and $f_{4,max}$ may be defined as constraints for the performance specifications (1105). In step 3, the problem may be written as a generic optimization problem with the specified constraints (1108). In step 4 (1110), the optimization problem is posed as an LCLP-R problem in standard form (as in equation 13); it is solved and one or more optimized values $x_{op}$ result (1112). The resulting program can be transformed into a convex problem and can be solved using any number of available methods, such as, for example, an interior point method (which is implemented in the commercially available software MOSEK, among other available solutions).

Figure 12:
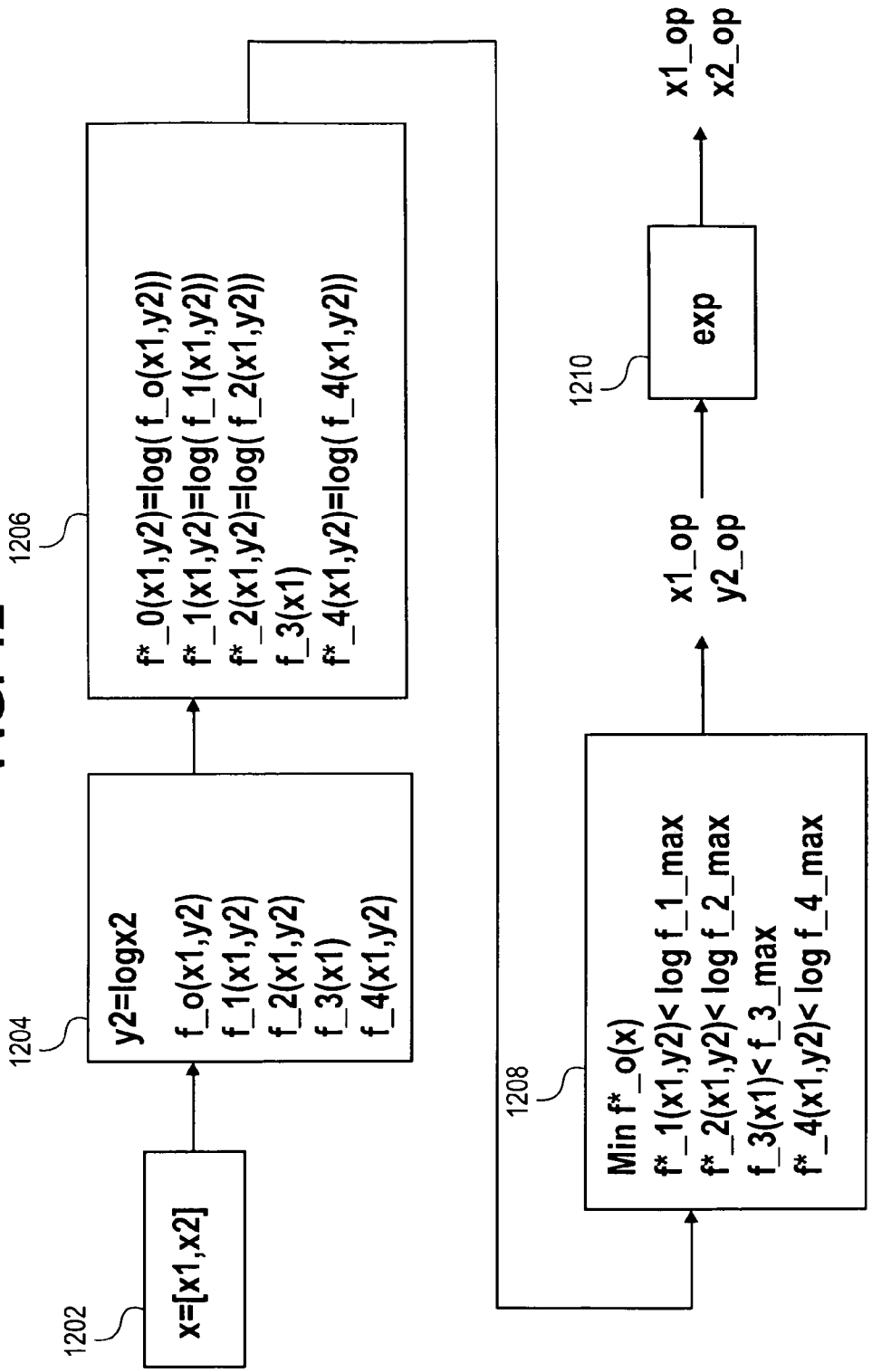
FIG. 12 is a flow diagram representing the solution of a log-convex linear restricted (LCLP-R) problem in accordance with an embodiment of the present invention.

FIG. 12 represents a flow diagram for solving the LCLP-R problem in FIG. 11 in accordance with an embodiment of the present invention. FIG. 12 specifically focuses on the details of the solving step 4 (1110) in FIG. 11. We distinguish the design parameters into two types $x_1$ and $x_2$ (step 1202). Starting with objective function $f_0(x_1,x_2)$ and the performance specifications $f_1(x_1,x_2)$, $f_2(x_1,x_2)$, $f_3(x_1,x_2)$, and $f_4(x_1,x_2)$, we take the logarithm of $x_2$ and perform a change of variables ($y_2=\log(x_2)$) and rewrite $f_0(x_1,x_2)$, $f_1(x_1,x_2)$, $f_2(x_1,x_2)$, $f_3(x_1,x_2)$, and $f_4(x_1,x_2)$ in terms of the new variable $y_2$ (step 1204). Then we proceed to take the log of all $f_i(x_1,y_2)$ that are not linear on $x_1$ (step 1206). (In this example, we assume that $f_3$ is linear on $x_1$ and that $f_4$ is not posynomial on any variables or exponential of variables). Upon defining optimization values for each of the performance specifications, the result is an LCLP-R problem in convex form that can be readily solved for the optimal values $x_{1,op}$ and $y_{2,op}$ (step 1208). Then, in step 1210, we take the exponential of $y_{2,op}$ to obtain the optimal result $x_{2,op}$ in the original variables. Note that the problem in step 1208 is not a geometric program in convex form.

Non-convex problem—LCLP-R-L-1. In another aspect of the present invention, a non-convex problem may be solved by sequentially approximating it as an LCLP or an LCLP-R problem. One such problem is referred to an LCLP-R-L-1 problem in standard form. Consider the following optimization problem:

minimize $s_o(x_1,x_2)$ s.t. $s_i(x_1,x_2) \leq 1$ $i=1,\ldots,n_1$ $s_i^2(x_2)=1$ $i=1,\ldots,n_2$ $g_i(x_1,x_2)=1$ $i=1,\ldots,n_3$ $g_i^1(x_1)=0$ $i=1,\ldots,n_4$ $h_i(x_1,x_2) \leq 1$ $i=1,\ldots,n_5$ $x_2 \geq 0$ (17)

where

1. $s_i$ are signomial on $e^{x_1}$ and $x_2$.
2. $s_i^2$ are signomial on $x_2$.
3. $g_i$ are monomial on $e^{x_1}$ and $x_2$.
4. $g_i^1$ are linear on $x_i$.
5. $h_i$ are log-convex on $x_1$ and $y_2=\log x_2$ but not posynomial on $e^{x_1}$ and $x_2$.
6. $f_0$ can take any of the form $f_i$, $f_i^2$, $g_i$, $g_i^1$, or $h_i$.

We call problem (17) an LCLP-R-L-1 problem in standard form. Problem (17) is in general a non-convex optimization problem because we allow functions $s_i$ and $s_i^2$ to be signomials (i.e., they have negative coefficients). Signomials are described in greater detail below. Note that since functions $s_i$ and $s_i^2$ are signomial, they are not, in general, log-convex functions of variables $x_1$ and $\log x_2$. Accordingly, problem (17) cannot be converted in general into a convex problem.

Signomial Programming. A signomial is a function with the same form as a posynomial, but where the coefficients $C_k$ are allowed to be negative. Signomials include as special cases posynomials (and therefore also monomials) and (positive or negative) constants. Any signomial can be expressed as the difference between two posynomials, by collecting together the terms with positive coefficients, and also the terms with negative coefficients. Signomials are closed under addition, subtraction, and multiplication. A signomial that is divided by a signomial that is nonzero and has only one term (i.e., a monomial, or the negative of a monomial) is still a signomial. A signomial raised to any nonnegative integer power is also a signomial.

A generalized geometric program or signomial program is defined as:

minimize $s_0(x)$ subject to $s_i(x) \leq 1$, $i=1,\ldots,m$, $x_i>0$, $i=1,\ldots,n$, where the $s_i$ are signomial functions, i.e., sums of monomial functions with no sign restrictions on the coefficients. Relaxing the requirement that all monomial terms have positive coefficients comes at a high cost: no general statements can be made about the convexity of a signomial program and the resulting problem may be extremely difficult to solve.

Although one can use a general purpose nonlinear solver, various special purpose methods for solving signomials have been proposed. For example, several solvers for finding local minima of signomial programs are based on the concept of a condensed posynomial. The concept of the condensed posynomial is itself based on the arithmetic-geometric mean inequality. We briefly describe the arithmetic mean inequality and the condensed posynomial, below.

Arithmetic-geometric mean inequality: For any vector w>0 and any non-negative vector $\epsilon$ whose components sum to one $$\left(\sum \epsilon_i = 1\right),$$

we have $$\sum_i w_i \geq \prod_i \left(\frac{w_i}{\epsilon_i}\right)^{\epsilon_i},$$

where $(w_i/\epsilon_i)^{\epsilon_i}$ is defined to be one if $\epsilon_i=0$.

Condensed posynomial: Given a posynomial $$f(x) = \sum_i g_i(x)$$

and a vector $\epsilon$ whose components sum to one $$\left(\sum \epsilon_i = 1\right),$$

the equivalent condensed posynomial $f_c(x)$ with weights $\epsilon$ is defined as $$f_c(x) = \prod_i \left(\frac{g_i(x)}{\epsilon_i}\right)^{\epsilon_i}.$$

We note that the condensed posynomial is a monomial function and that for a given x we always have $f(x) \leq f_c(x)$.

The general approach of methods based on the condensed posynomial method includes approximating the posynomial with negative terms in a signomial program by condensed posynomials (a monomial term). Most solvers are iterative: a signomial program is approximated by a posynomial program using some (possibly arbitrary) set of weights; the solution to the approximate problem is then used to select a new set of weights, and a new posynomial approximation of the original problem is found. Under some conditions, this iterative process can converge to a local minimum of the original signomial problem.

One can also approximate the posynomial constraints and objective by condensed posynomials (thus ending with all monomial constraints). After taking logarithms, the approximate problem is just a linear program. Several iterative methods for solving signomial programs using linear programs have also been developed. Finally, one can also use general-purpose optimizers to solve the signomial programs, although in general they do not perform as well as the solutions described above.

In practice, problems arising in analog circuit design contain a small number of equations that are signomial. Although the resulting problem is not convex, it still has a special form and can be solved using a special-purpose solver. Recently, it has been shown how to use signomial programming for operational amplifier design.

Referring back to problem (17), above, if the designer restricts $s_{i,j}$ and $s_{i,j}^2$ to be posynomial, problem (17) becomes an LCLP-R problem in standard form (problem (13)).

Figure 7:
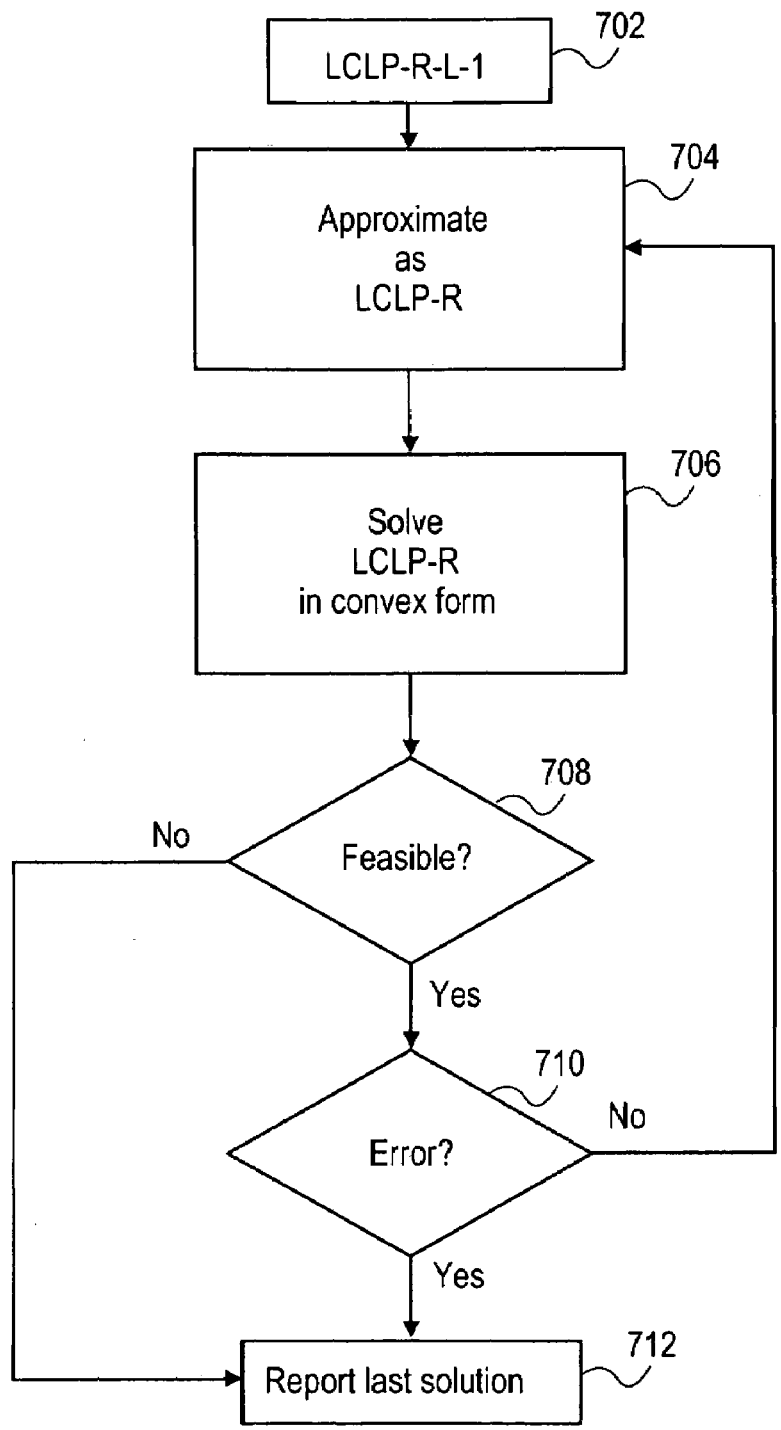
FIG. 7 is a flow chart describing a method for solving the LCLP-R-L-1 problem in accordance with an embodiment of the present invention.

Algorithm for solving the LCLP-R-L-1 Problem. Disclosed herein is a superior approach for solving problem (17) by using a simple algorithm that includes solving a sequence of convex approximations of the original problem. Reference is made to FIG. 7, which is a flow chart describing a method for solving the LCLP-R-L-1 problem in accordance with an embodiment of the present invention. We begin by considering an LCLP-R-L-1 problem in standard form, as set forth in problem (17) above (block 702). In step 704, the LCLP-R-L-1 problem is approximated as an LCLP-R problem that is locally convex around some point. The key to this approximation is to transform the signomial terms into posynomial terms or other terms commensurate with an LCLP-R problem. This approximation can be performed using a variety of methods. For example, the designer can approximate signomial constraints with posynomial constraints using the condensation techniques described above. Alternatively, the designer can approximate signomial constraints by approximating the monomial terms with negative coefficients with a least-squares best fit monomial. Whatever appropriate estimation is used, the result is an LCLP-R problem that is locally convex around some point x, which the designer selects (the initial selection of x may or may not be feasible). Notably, the availability of this technique dramatically expands the types of circuit problems that can be efficiently and accurately solved using the methods of the present invention.

Next, in step 706, the resulting LCLP-R problem is solved in convex form. To perform this step, the designer uses the initial point x and a tolerance $\epsilon \geq 0$. Using methods described above in connection with solving the LCLP-R problem, an optimal point $x^{â}$ is computed. Thereupon, at step 708, the feasibility of the selection of the initial point x is determined by computing the magnitude of the approximation error at the solution point $x^{â}$. If the solution is not feasible, then the last solution may be reported (step 712).

In one embodiment, the approximation error is determined by the following equation:

$$E = \max\left|\frac{f_{i,approx}(x^{â}) - f_{i,exact}(x^{â})}{f_{i,exact}(x^{â})}\right|.$$

In step 710, a determination is made as to whether the computed error $E \leq \epsilon$. If not, and the problem is feasible, then the initial point x is updated with the value $x^{â}$, and the procedure is repeated beginning again at step 704 until either $E \leq \epsilon$ or a maximum number of iterations (e.g., a maximum number set by a computer program executing the method) is reached.

In performing these steps, we are able to convert an otherwise difficult problem to solve into a much easier problem. In addition, feasibility is determined, and precision may be obtained in computing the optimized value $x^{â}$ by repeating the steps until the margin of error is acceptable.

Circuit Modeling. In this section, we apply the principles of the present invention to specific problems in circuit design. As will be seen, the benefits and advantages of the new methods are significant. For a circuit design problem we choose the following design variables. We begin in this embodiment by defining the following general design parameters:

$x_1$:V  (18)

$x_2$:I,S  (19)

where V represents voltages, I represents currents and S represents sizes of passive and active devices. Thus, the voltages are $x_1$ type and currents and sizes are $x_2$ type variables as $x_1$ and $x_2$ have been described in the previous sections.

The various circuit constraints may be formulated as follows, although numerous other variations on these methods are possible and do not depart from the scope of the present invention:

(i). Kirchoff's voltage law is handled as a linear constraint on $V_i$, i.e., it corresponds to a constraint of the form $g_i^1(x_1)$.

(ii). Kirchoff's current law is handled as a signomial constraint on $I_i$, i.e., it corresponds to a constraint of the form $s_i(x_2)$.

(iii). Nonlinear characteristics of transistors are approximated with a set of log-convex constraints in terms of V and log I, log S, i.e., they correspond to either a constraint of the form $h_i(x_1,x_2)$ or of the form $s_i(x_1,x_2)$.

(iv). Linear characteristics of elements such as resistors are approximated with signomial constraints in terms of $V_A$ and log I, log S, where $V_A$ is defined by the Taylor approximation of voltage V wherein $e^v = 1 + V_A + V_A^2/2! + V_A^3/3! + \ldots$. Specifically, $V_A$ is an $x_2$ type parameter that approximates the real voltage ($x_1$ parameter) with an equality in the form of $s_i(x_1, x_2)$.

(v). Equations that represent circuit performance are represented with signomial constraints on $e^V$ and I,S, i.e., they correspond to a constraint of the form $s_i(x_1,x_2)$. They may also be a signomial constraint on only I,S, i.e., a constraint of the form $s_i^2(x_2)$.

With these assumptions, the circuit design problem may then be posed as an LCLP-R-L-1 problem that can be solved with the algorithm described above.

Because Kirchoff's voltage law is handled as a linear constraint on $V_i$, the optimization method in one embodiment of the present invention can accurately model Kirchoff's voltage law, unlike existing geometric programming methods. Further, given that Kirchoff's current law is generally handled as a signomial constraint on $I_i$, the optimization method in one embodiment can accurately model device currents computed using KCL. As described above, signomials can be condensed or approximated in several ways to degenerate the problem into an LCLP-R that is convex.

Similarly, in this embodiment, transistor behavior can be modeled accurately using log convex and signomial constraints, wherein such constraints may be approximated as posynomial or monomial constraints and the problem may degenerate into an LCLP-R that is locally convex, as described in the LCLP-R-L-1 problems, above.

Two special cases of the above problem are readily apparent. The first is one in which all signomial constraints are posynomial. In that case the resulting optimization problem is an LCLP-R problem, i.e., a problem that can be transformed into a convex problem and thus can be solved very efficiently. The second is one in which all signomial constraints are posynomial and there are no generic log-convex functions $h_j$. In the latter case, the resulting optimization problem is an LCLP problem, i.e., a problem that can be transformed into a convex problem and thus can also be solved very efficiently.

Figure 8:
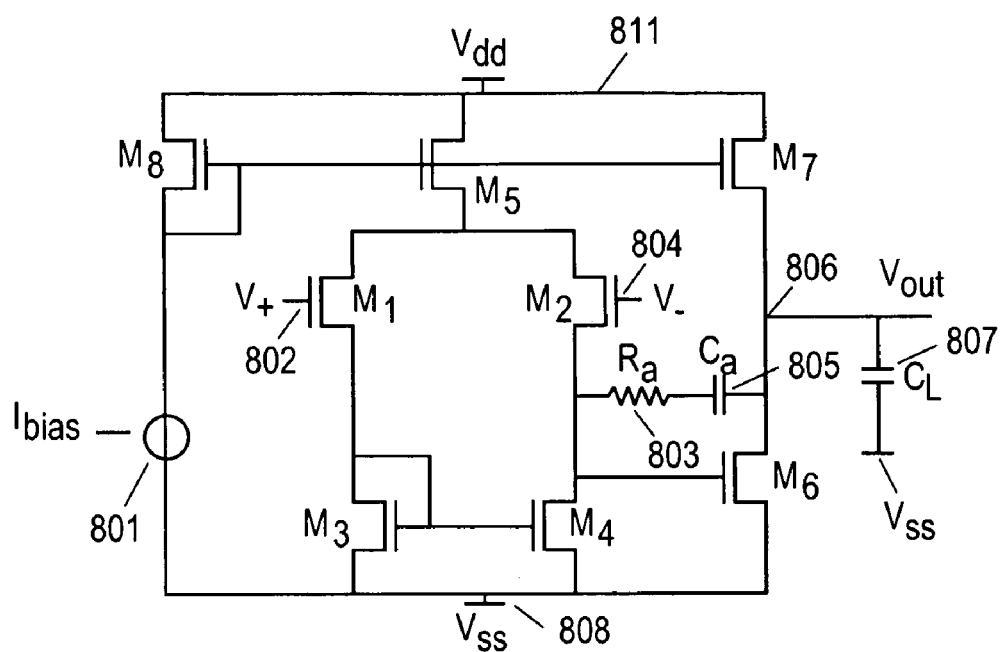
FIG. 8 is an exemplary CMOS operational amplifier upon which an embodiment of the principles of the present invention is applied to produce optimized design parameters.

The circuit design methodologies in one embodiment of the present invention are now described by modeling an illustrative operational amplifier. While this example is described in the context of a CMOS analog circuit having the designated parameters, the problem is not limited to the selected performance specifications or circuit topology; additional or alternative performance specifications can be added to the circuit description. In addition, the principles of the present invention are not limited to this circuit topology or to MOS technology. They are equally applicable to other circuit topologies, bipolar junction transistors (BJT), Gallium Arsenide technology, and other semiconductor processes and circuit techniques. FIG. 8 is an exemplary CMOS operational amplifier upon which an embodiment of the principles of the present invention is applied to produce optimized design parameter values. The circuit as shown in FIG. 8 has two op-amp inputs V+ (node 802) and V− (node 804). An op-amp output is at $V_{out}$ (node 806). The op-amp shown in FIG. 8 is a two stage op-amp, with a first stage including transistors M1 through M5, and a second stage including transistors M6 through M8 as well as bias current source 801. The op-amp also includes a ground node 808, resistor $R_C$ (803), capacitor $C_C$ (805) and load capacitor $C_L$ (807). Power supply $V_{dd}$ feeds node 811.

In the CMOS op-amp shown in FIG. 8, transistors, M3, M4 and M6 are NMOS transistors, whereas transistors M1, M2, M5, M7 and M8 are PMOS transistors. In step 1 of the optimization problem, the design parameters (variables) for which optimization is sought may be chosen, by way of example, as follows:

$$x_1: V_{g_1}, V_{g_2}, V_{d_1}, V_{d_2}, V_{s_1}, V_{g_5}, V_{d_6}$$

$$x_2: W_i, L_i, I_i, I_{bias} \text{ for } i=1,\ldots,8$$

In step 2, the circuit problems are described as equations. As noted above, the equation capture can be performed manually, or through automated (e.g., software) means, or both. The KVL-based equations of the circuit may first be described. Note that each of these equations take the form of linear constraints. Here, we have:

$$|V_{ds,1}| = |V_{d_1} - V_{s_1}|$$

$$V_{ds,6} + |V_{ds,7}| = V_{dd}$$

$$|V_{ds,5}| + |V_{ds,1}| + V_{ds,3} = V_{dd}$$

$$|V_{ds,8}| + V_{I_{bias}} = V_{dd}$$

$$|V_{ds,1}| + V_{ds,3} = |V_{ds,2}| + V_{ds,4}$$

Next, the KCL-based equations associated with the op-amp in FIG. 8 may be described. The KCL-based equations include both monomial and signomial constraints. The monomial constraints include:

$$I_1 = I_2$$

$$I_6 = I_7$$

$$I_8 = I_{bias}$$

The signomial constraint includes:

$$I_5 = I_1 + I_2$$

Since $I_1$ and $I_2$ are identical as evident from FIG. 8, the above equation can be written as a monomial constraint:

$$I_5 = \frac{I_1}{2}$$

Now various exemplary performance characteristics of the transistors can be modeled. Different or additional models are possible.

Bias Equations for transistor M1: These equations include the following linear constraints:

$$V_{sb,1} = V_{dd} - (V_{cm} + V_{gs,1})$$

$$V_{db,1} = V_{dd} - (V_{gs,3})$$

$$V_{ds,1} = V_{db,1} - V_{sb,1}$$

$$V_{ds,1} \geq V_{gs,1} - V_{t,1}$$

$$I_{ds,1} = c_I W^{\alpha 1,1} L^{\alpha 1,2} e^{(\alpha 1,3 V_{ds,1})} e^{(\alpha 1,4 V_{gs,1})} e^{(\alpha 1,5 V_{sb,1})}$$

Transconductance: We can accurately represent device transconductance with the following monomial constraints on variables $e^{x_1}$ and $x_2$:

$$g_m = c_{gm} W^{\alpha gm,1} L^{\alpha gm,2} I^{\alpha gm,6} e^{\alpha gm,3 V_{ds}} e^{\alpha gm,4 V_{gs}} e^{\alpha gm,5 V_{sb}}$$

Drain-to-Bulk Capacitance: We can represent the drain-to-bulk capacitance per unit area with the following log-convex constraint:

$$C_{db} = \frac{L_{diff} W C_{C_{db0}}}{\left(1 + \left|\frac{V_{ds}}{\phi_j}\right|\right)^{0.5}}$$

where $L_{diff}$, $C_{C_{db,0}}$ and $\phi_j$ are process dependent constants. Note that this equation is in LCLP-R form and can be efficiently solved using the methods described above. As noted above, numerous other transistor parameters may be modeled such as device output conductance, gate-to-source capacitance, saturation voltage, etc. The methodology is very similar: the designer just needs to model those performance characteristics as linear functions of $x_1$ variables, monomial or posynomial functions of $e^{x_1}$ and $x_2$, or log-convex functions of $x_1$ and $\log x_2$ Linear Characteristic of Resistors and Capacitors. Because the capacitor $C_C$ 805 and resistor $R_C$ 803 in the example in FIG. 8, are connected in series, no current flows through them during DC operation. As a result, we do not need to consider KVL and KCL around them to determine voltages and currents at other points in the circuit.

Circuit Performance Constraints. Included below are certain illustrations of various circuit performance constraints that may be modeled and optimized. One such constraint is Quiescent power. The quiescent power is given by the product of the supply voltage and the total current consumed by the circuit:

$$P = V_{dd}(I_8 + I_5 + I_7)$$

If, for example, the designer would like to impose a maximum quiescent power on the circuit, the designer can write the following posynomial constraint on $x_2$ variables:

$$V_{dd}(I_8 + I_5 + I_7) \leq P_{max}$$

Another circuit based parameter that may be modeled is 3-dB bandwidth. The op-amp shown in FIG. 8 has a dominant pole at $$p_1 = \frac{(gd_1 + gd_2)(gd_6 + gd_7)}{C_c g_{m,6}},$$

where the device output conductances $gd_i$ can be represented as monomials or posynomials of the devices W, L, I, $e^{V_{GS}}$, $e^{V_{DS}}$, and $e^{V_{SB}}$. If we wanted to impose a minimum required frequency for the dominant pole, we may impose the following signomial constraint on variables $e^{x_1}$ and $x_2$.

$$\frac{(gd_1 + gd_2)(gd_6 + gd_7)}{C_c g_{m,6}} \geq \omega_3$$

The open loop gain of the operational amplifier of FIG. 8 may also be modeled. The open-loop gain is given by the following equation:

$$A = \frac{g_{m,1}}{(gd_1 + gd_2)} \frac{g_{m,6}}{(gd_6 + gd_7)}$$

where the device output conductances $gd_i$ and transconductances $gm_i$ can be represented as monomials or posynomials of the devices W, L, I, $e^{V_{GS}}$, $e^{V_{DS}}$, and $e^{V_{SB}}$. Thus a constraint on a minimum required open-loop gain is give by the following posynomial constraint on variables $e^{x_1}$ and $x_2$.

$$\frac{(gd_1 + gd_2)}{g_{m,1}} \frac{(gd_6 + gd_7)}{g_{m,6}} \leq \frac{1}{A_{max}}$$

There are many other constraints such as unity-gain bandwidth, phase margin, input-referred noise, input-referred offset, etc. The method is similar: one needs to represent the circuit performance specifications as linear functions of $x_1$ variables, monomial or posynomial functions of $e^{x_1}$ and $x_2$ or log-convex functions of $x_1$ and $\log x_2$.

In step 3, the optimization problem may be written and formalized as described above. This step may include minimizing an objective subject to identified constraints. The designer here has a large variety of choices in formulating the optimization problem depending on his or her goals and objectives in light of the problem at hand. An exemplary optimization problem for this application would be to minimize the quiescent power consumption, $V_{dd}(I_8+I_5+I_7)$, subject to the 3-dB bandwidth constraint, the open-loop gain constraint, KVL constraints, KCL constraints, and all other relevant constraints which describe the performance of this op-amp circuit in equation form. The quiescent power consumption in this example would represent the objective function, although many other options for this function and its associated constraints are open to the designer.

In step 4, the formalized optimization problem may be solved. The specific method depends on what type of problem results from step 3. For example, where the design problem is an LCLP problem, the problem is first solved by converting it into its convex form, and then applying one of the several known methods for obtaining optimized design parameters (i.e., numerical values of the design parameters). Where the design problem is an LCLP-R problem, the problem is solved by first converting the LCLP-R problem into its convex form and then solving it. Alternatively, where the design problem is an LCLP-R-L-1 problem, the problem may be solved using the algorithm described above.

Figure 9:
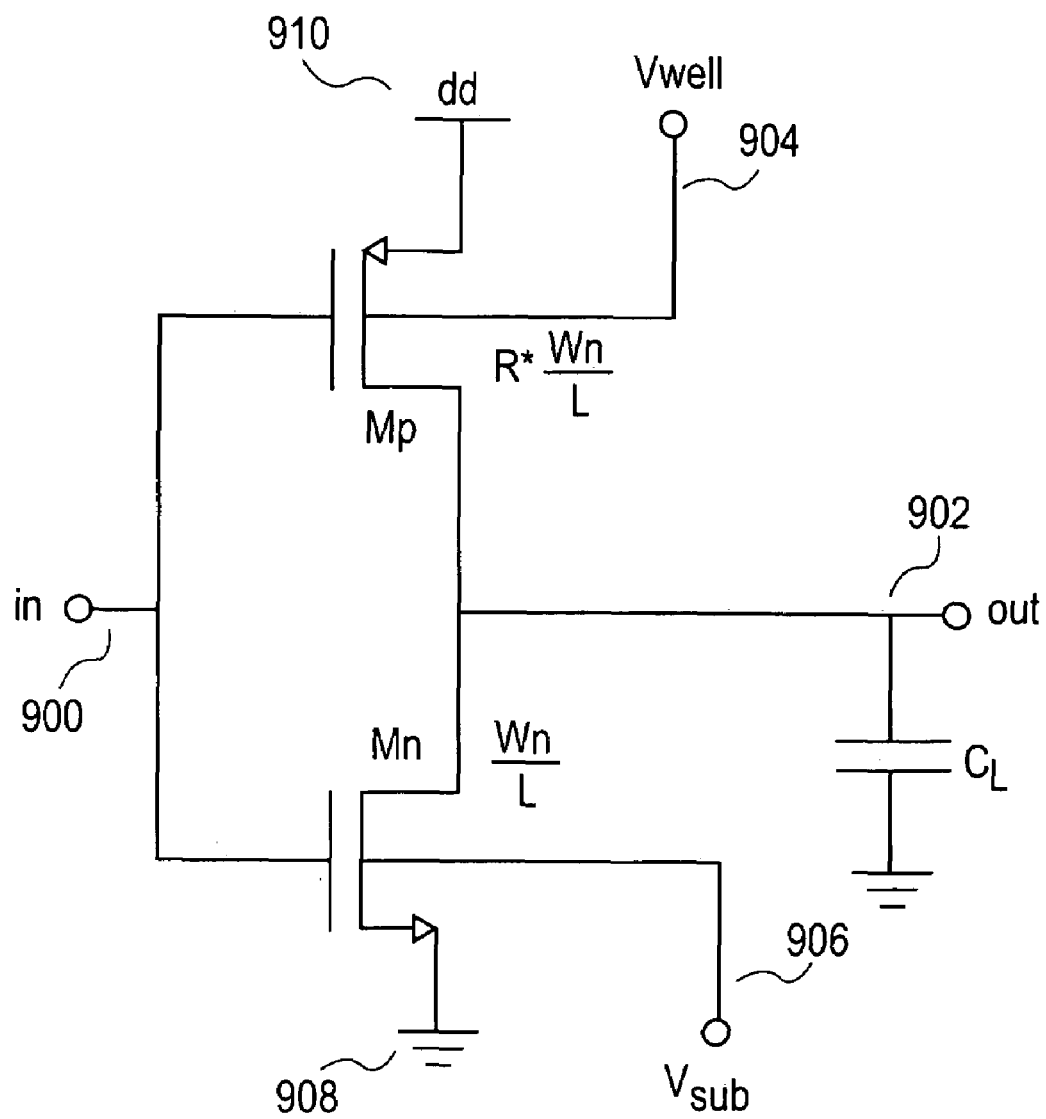
FIG. 9 is an exemplary CMOS inverter upon which an embodiment of the principles of the present invention is applied to produce optimized design parameters.

Referring now to FIG. 9, a CMOS inverter is illustrated for purposes of using an embodiment of the present invention to solve a delay calculation. The inverter includes a PMOS transistor $M_p$ having a gate coupled to input node 900, a source coupled to power (dd) node 910, a well node at 904, and a drain coupled to output node 902. An NMOS transistor $M_n$ has its gate coupled to input node 900, drain coupled to output node 902, source coupled to ground node 908, and a substrate node 906. A load capacitor $C_L$ is coupled between output node 902 and ground node 906. The size difference between the NMOS and PMOS transistors is represented by a factor of R.

In this section we show a simple example of the design of an inverter chain. This is a popular problem in circuit design since more complex gate sizing problems can be formulated as an equivalent inverter chain sizing problem. Certain simplifying assumptions are made in this problem: we do not consider the delay introduced by wires, we assume fixed slew rates and constant NMOS/PMOS ratio, R, as shown in FIG. 9.

The first step is to choose the appropriate design variables. For example:

$x_1: V_{th_i}$ $x_2: W_N, L$ where $V_{th}$ is the transistor threshold voltage, which is controlled by $V_{sub}$ and $V_{well}$ as shown in FIG. 9. The second step is to formulate equations describing the circuit problem.

Operating Point

In this problem, we do not need to consider equations that define the operating point because the CMOS inverter in FIG. 9 is a dynamic circuit. As such, we do not include KVL equations, KCL equations, or equations that define current-voltage characteristics of the nonlinear and linear devices.

Circuit Performance

To model the circuit performance we first obtain a model for one of the inverters in the chain. Many other models are possible; the model having the characteristics defined below is merely one possible model. The three parameters considered for circuit performance in this example are delay, dynamic power, and leakage power. For delay calculations, the inverter may be modeled as $$t_d = \frac{K_d V_{dd}}{(V_{dd} - V_{th})^{\alpha_d}} \cdot \left( \frac{w_{out}}{w_{in}} + \frac{w_{par}}{w_{in}} \right), \quad (20)$$

where $K_d$ and $\alpha_d$ are fitting parameters, $w_{out}/w_{in}$ measures the electrical fan-out of the gate, $w_{par}/w_{in}$ measures the intrinsic delay of the gate, $V_{dd}$ is the supply voltage, and $V_{th}$ is the threshold voltage.

Equation (20) can be rewritten as:

$$t_d = \frac{K_d V_{dd}^{1-\alpha_d}}{\left(1 - \frac{V_{th}}{V_{dd}}\right)^{\alpha_d}} \cdot \left( \frac{w_{out}}{w_{in}} + \frac{w_{par}}{w_{in}} \right),$$

which can be approximated as $$t_d = K_d V_{dd}^{1-\alpha_d} \alpha_d e^{-\frac{V_{th}}{V_{dd}}} \cdot \left( \frac{w_{out}}{w_{in}} + \frac{w_{par}}{w_{in}} \right) \quad (21)$$

Equation (21) represents a posynomial function of $e^{x_1}$ and $x_2$ or log-convex functions of $x_1$ and $\log x_2$.

Dynamic power represents the power dissipation that occurs by virtue of the switching of the gate. Dynamic power may be modeled in this example as $$e_{SW} = \alpha \cdot K_e \cdot (w_{out} + w_{par}) \cdot V_{dd}^2,$$

where $\alpha$ represents the probability of the gate switching and $K_e$ is a fitting parameter. Additionally, leakage power of a gate with $V_{gs}=0$ may be modeled as $$e_{Lk} = D \cdot w_{in} \cdot I_0(S_{in}) e^{-\frac{(V_{th} - \gamma V_{dd})}{V_0}}, \quad (22)$$

where D is the cycle time, $I_0(S_{in})$ is the normalized leakage current of the gate with inputs in state $S_{in}$, $V_0 = nkT/q$ and $\gamma$ account for the subthreshold slope and DIBL factor respectively. We can approximate equation (22) as $$e_{Lk} = D \cdot w_{in} \cdot I_0(S_{in}) e^{-\frac{V_{th}}{V_0}} \left(1 + \frac{\gamma V_{dd}}{V_0}\right).$$

For step three in solving the above described parameters for the circuit in FIG. 9, the designer may write out (or the software package may produce) the optimization problem. As described above, this step may include minimizing some objective function subject to one or more constraints. Depending on the application and objectives of the designer, a wide variety of possibilities exist. One optimization problem would be to minimize the delay of the inverter, $$K_d V_{dd}^{1-\alpha_d} \alpha_d e^{-\frac{V_{th}}{V_{dd}}} \cdot \left( \frac{w_{out}}{w_{in}} + \frac{w_{par}}{w_{in}} \right),$$

subject to the dynamic power, leakage power, and other relevant constraints which describe the performance of this inverter circuit in equation form.

Finally, in step four, the articulated optimization problem may be solved. Using the principles of the present invention, the optimization problem composed in step three is solved in an efficient manner. The specific method depends on what type of problem results in step three.

The methods proposed herein are equally applicable to circuits designed using bipolar transistors as well as other circuit topologies and fabrication technologies.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

We claim:

1. A method to optimize a circuit having components characterized by one or more design parameters, comprising:
generating a posynomial function f in standard form comprising an exponent of a first design parameter;
providing one or more constraint values for the circuit;

generating a convex optimization problem that includes the one or more constraint values and the posynomial function f in convex form; and, solving the convex optimization problem to produce one or more optimized design parameter values for the circuit; and, creating a computer readable design for said circuit that includes said one or more optimized design parameter values.

2. The method of claim 1 wherein the posynomial function f further comprises a second design parameter.

3. The method of claim 1 further comprising generating a linear function $g_1$ of any of the one or more design parameters.

4. The method of claim 3 wherein the linear function $g_1$ comprises the first design parameter.

5. The method of claim 4 wherein the linear function $g^1$ is used to compute the optimized design parameter values for one or more voltage values in the circuit.

6. The method of claim 5 wherein the one or more voltage values are calculated using Kirchoff's voltage law.

7. The method of claim 1 further comprising generating an expression comprising a second posynomial function $f^2$ of any of the one or more design parameters.

8. The method of claim 1 wherein design parameters for transistors are selected.

9. The method of claim 8 wherein the transistors comprise Metal-Oxide-Semiconductor (MOS) transistors.

10. The method of claim 9 wherein the design parameters comprise a transistor drain current.

11. The method of claim 9 wherein the design parameters comprise any of:
(a) a transistor width (W);
(b) a transistor length (L);
(c) a two-terminal voltage of one of the MOS transistors; and
(d) a two-terminal capacitance of one of the MOS transistors.

12. The method of claim 9 wherein the design parameters comprise a gate-to-source capacitance $c_{gs}$.

13. The method of claim 9 wherein the design parameters comprise a transconductance $g_m$ of a transistor.

14. The method of claim 9 wherein the design parameters comprise an output conductance $g_{ds}$ of a transistor.

15. The method of claim 9 wherein the design parameters comprise one or more parameters of a transistor in a weak inversion region of operation.

16. The method of claim 9 wherein the design parameters comprise one or more parameters of a transistor in a strong inversion region of operation.

17. The method of claim 9 wherein the design parameters comprise one or more parameters of a transistor in a sub-threshold region of operation.

18. The method of claim 9 wherein the design parameters comprise a gate-to-source voltage $V_{gs}$.

19. The method of claim 8 wherein the transistors comprise Bipolar Junction Transistors (BJTs).

20. The method of claim 19 wherein the design parameters comprise a collector-emitter current $I_{ce}$ of a transistor.

21. The method of claim 1 wherein the design parameters comprise a semiconductor junction capacitance.

22. Computer-readable media embodying a program of instructions executable by a computer program to perform a method to optimize a circuit having components characterized by one or more design parameters, comprising:

generating a posynomial function f in standard form comprising an exponent of a first design parameter;

providing one or more constraint values for the circuit;

generating a convex optimization problem that includes the one or more constraint values and the Dosvnomial function f in convex form; and, solving the convex optimization problem to produce one or more optimized design parameter values for the circuit; and, creating a computer readable design for said circuit that includes said one or more optimized design parameter values.

23. The computer-readable media of claim 22 wherein the posynomial function f further comprises a second design parameter.

24. The computer-readable media of claim 22 further comprising generating a linear function $g_1$ of any of the one or more design parameters.

25. The computer-readable media of claim 24 wherein the linear function $g_1$ comprises the first design parameter.

26. A method to optimize a circuit using convex optimization with at least one design parameter, comprising:

minimizing an objective function f, wherein the f is posynomial on an exponent of the design parameter; when expressed in standard form;

solving the f to obtain at least one optimized design parameter value; and, creating a computer readable design for said circuit that includes said one or more optimized design parameter values.

27. The method of claim 26 wherein the design parameter comprises a voltage variable.

28. The method of claim 26 wherein the design parameter comprises a property of a transistor.

29. A method, comprising:

generating a computer readable convex optimization problem whose constraints are based on equations that describe an electronic circuit's operation, one of said constraints of said computer readable convex optimization problem including a logarithm of a mathematical function that includes an $e^x$ term where said $e^x$ term is an approximation of a term that appears in said function when said function is properly expressed in standard form without said approximation having been made;

solving said convex optimization problem by processing software program code with a computing system, said solving producing a numerical result;

calculating e raised to said numerical result to determine an optimized value for a design parameter of said circuit; and, incorporating said optimized value into a computer readable design of said circuit.

30. The method of claim 29 wherein said generating includes performing the following by processing software program code:
a) articulating a mathematical function that describes an aspect of said circuits' operation;
b) articulating a logarithm of said function with one or more approximations including at least said approximation.

31. The method of claim 30 further comprising using said computer readable design of said circuit as a basis for simulating said circuits operation.

32. The method of claim 30 wherein said term takes the form of 1+kV.

33. The method of claim 30 wherein said term takes the form of $(1+kV)^{-1}$.

34. The method of claim 30 wherein said term takes the form of $(1+2 kV)^{0.5}$.

35. The method of claim 30 wherein said convex optimization problem is a log convex linear problem (LCLP).

36. The method of claim 30 wherein said convex optimization problem is a restricted log convex linear problem (LCLP-R).

37. The method of any of claims 30 further comprising processing respective portions of program code to perform said generating and said incorporating.

38. The method of claim 37 further comprising processing respective portions of software program code to perform said generating, said calculating and said incorporating.

* * * * *